(12) United States Patent
Do et al.

(10) Patent No.: US 10,485,119 B2
(45) Date of Patent: Nov. 19, 2019

(54) DISPLAY DEVICE AND METHOD OF MANUFACTURING WINDOW MEMBER

(71) Applicant: SAMSUNG DISPLAY CO., LTD., Yongin-si, Gyeonggi-do (KR)

(72) Inventors: Yunseon Do, Hwaseong-si (KR); Byungchoon Yang, Seoul (KR); Hyesog Lee, Osan-si (KR); Jaejoong Kwon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

(21) Appl. No.: 15/161,037

(22) Filed: May 20, 2016

(65) Prior Publication Data

US 2017/0079150 A1   Mar. 16, 2017

(30) Foreign Application Priority Data

Sep. 16, 2015   (KR) ........................ 10-2015-0131097

(51) Int. Cl.
| | |
|---|---|
| *H05K 5/02* | (2006.01) |
| *H05K 5/03* | (2006.01) |
| *G02F 1/1333* | (2006.01) |
| *G02F 1/1335* | (2006.01) |

(52) U.S. Cl.
CPC ......... *H05K 5/02* (2013.01); *G02F 1/133308* (2013.01); *G02F 1/133512* (2013.01); *H05K 5/03* (2013.01); *G02F 2001/133331* (2013.01); *Y10T 428/10* (2015.01); *Y10T 428/1059* (2015.01)

(58) Field of Classification Search
CPC ...... H05K 5/02; H05K 5/03; G02F 1/133308; G02F 1/1339; G02F 2001/133314; G02F 2001/133318; G02F 2001/13332
USPC .......... 428/1.1, 1.5, 166; 361/813, 808, 829; 216/24
See application file for complete search history.

(56) References Cited

U.S. PATENT DOCUMENTS

| | | | |
|---|---|---|---|
| 2008/0084681 A1* | 4/2008 | Naito ................... | H05K 9/0096 361/818 |
| 2013/0308316 A1 | 11/2013 | Kim et al. | |
| 2014/0178647 A1 | 6/2014 | Kim et al. | |

(Continued)

FOREIGN PATENT DOCUMENTS

| | | |
|---|---|---|
| CN | 103064219 A | 4/2013 |
| CN | 103257470 A | 8/2013 |

(Continued)

OTHER PUBLICATIONS

EPO Extended Search Report dated Oct. 26, 2016, for corresponding European Patent Application No. 16180512.2 (3 pages).

*Primary Examiner* — Ruiyun Zhang
(74) *Attorney, Agent, or Firm* — Lewis Roca Rothgerber Christie LLP

(57) ABSTRACT

A display device includes a display member configured to display an image; and a window member including a transmission area configured to transmit the image, and a bezel area having a color and arranged adjacent to the transmission area in a plan view, the window member including a base member in which a plurality of air gaps are defined in an area of the base member corresponding to the bezel area; and a color member in the air gaps to define the color of the bezel area.

29 Claims, 20 Drawing Sheets

(56) References Cited

U.S. PATENT DOCUMENTS

2015/0062841 A1   3/2015  Jin et al.
2015/0103264 A1   4/2015  Lee

FOREIGN PATENT DOCUMENTS

| EP | 2662749 A1 | 11/2013 |
|----|------------|---------|
| JP | 2012-168430 A | 9/2012 |
| KR | 10-2005-0106948 | 11/2005 |
| KR | 10-2009-0048263 | 5/2009 |
| KR | 10-2013-0059117 | 6/2013 |
| KR | 10-2013-0127655 | 11/2013 |
| KR | 10-2014-0082432 | 7/2014 |
| KR | 10-2015-0025875 | 3/2015 |
| KR | 10-2015-0042384 | 4/2015 |
| KR | 10-2017-0007670 | 1/2017 |

* cited by examiner

DISPLAY DEVICE AND METHOD OF MANUFACTURING WINDOW MEMBER

CROSS-REFERENCE TO RELATED APPLICATION

This application claims priority to and the benefit of Korean Patent Application No. 10-2015-0131097, filed on Sep. 16, 2015 in the Korean Intellectual Property Office, the entire content of which is hereby incorporated by reference.

BACKGROUND

1. Field

Aspects of embodiments of the present disclosure relate to a display device and a method of manufacturing a window member.

2. Description of the Related Art

In recent years, a variety of display devices, which may be applied to a multimedia information system, such as a television set, a mobile phone, a navigation system, a computer monitor, a game unit, etc., have been developed. The display device includes a display panel displaying an image, and a window member covering the display panel.

The window member includes a transmission area transmitting the image, and a bezel area disposed adjacent to the transmission area. The bezel area defines a bezel of the display device. The bezel of the display device may prevent circuits and components of the display device from being shown and improves an aesthetic design of the display device.

SUMMARY

According to an aspect of embodiments of the present disclosure, a display device includes a window member integrally formed with a bezel.

According to one or more embodiments of the present inventive concept, a display device includes a display member configured to display an image; and a window member including a transmission area configured to transmit the image, and a bezel area having a color and arranged adjacent to the transmission area in a plan view.

The window member may include a base member in which a plurality of air gaps are defined in an area of the base member corresponding to the bezel area; and a color member in the air gaps to define the color of the bezel area.

Each of the air gaps may have an average cross-sectional size equal to or greater than about 10 nm and equal to or smaller than about 1000 nm.

The air gaps may be randomly arranged in the base member.

The base member may include a front surface facing the display member, a rear surface exposed to an outside, and a plurality of connecting surfaces connecting the front surface and the rear surface, and at least one side portion of the color member may be exposed on the front surface.

The cross-sectional size of each of the air gaps may decrease as a distance from the rear surface decreases.

At least one of the air gaps may penetrate through the base member.

The window member may further include an insulating layer on at least one of the front surface and the rear surface to cover the bezel area, and the one side portion of the cover member may contact the insulating layer.

The color member may include a plurality of particles.

The particles may include pigments, dyes, or mixed particles of the pigments and the dyes, each of which has the color of the bezel area.

The particles may include a plurality of metal particles.

The color member may include a first color member representing a first color and a second color member representing a second color different from the first color.

An average size of the particles included in the first color member may be different from an average size of the particles included in the second color member.

The air gaps may include a plurality of first air gaps in which the first color member is arranged, and a plurality of second air gaps in which the second color member is arranged.

The first air gaps may have a size different from a size of the second air gaps.

The first air gaps may be distributed in an entire area of the bezel area, and the second air gaps may be concentrated in a portion of the bezel area.

The color member may be partially filled in each of the air gaps.

The window member may further include a filling member having a refractive index different from a refractive index of the base member, and each of the air gaps may be filled with the color member and the filling member.

The refractive index of the filling member may be less than about 1.5.

The display device may further include a cover member on the window member, and the cover member may be a glass substrate or a plastic substrate.

The window member may further include an intermediate member between the base member and the display member and having a color, the intermediate member may be overlapped with the bezel area, and the color of the intermediate member may be substantially the same as a color of the color member.

The color of the intermediate member may be a white color.

The filling member may have a thickness exceeding about 1 μm.

At least a portion of the bezel area in the window member may be bent, and the color member may be in the bent area of the bezel area.

The display device may further include an adhesive member between the window member and the display member to couple the window member and the display member, and the display member and the adhesive member may be bent to correspond to the window member.

According to one or more embodiments of the present inventive concept, a display device includes a display member configured to display an image; and a window member including a transmission area configured to transmit the image, and a bezel area having a color and arranged adjacent to the transmission area, the window member including a base member in which a plurality of air gaps are defined in an area of the base member corresponding to the bezel area; and a plurality of particles in the air gaps to define the color of the bezel area.

Each of the air gaps may have a size equal to or greater than about 10 nm and equal to or smaller than about 1000 nm.

The particles may include a plurality of pigment particles.

The particles may include a plurality of metal particles, a plurality of dye particles, or a mixture of the metal particles and the dye particles.

The metal particles may include a first metal particle representing a first color and a second metal particle representing a second color, and the first metal particle may have a size different from a size of the second metal particle.

According to one or more embodiments of the present inventive concept, a method of manufacturing a window member includes: providing a base member including a transmission area and a bezel area adjacent to the transmission area, the bezel area including first air gaps and second air gaps, each of the second air gaps having a cross-sectional area greater than a cross-sectional area of each of the first air gaps; coating a color source on a surface of the base member; and filling the color source in the first air gaps and the second air gaps.

The color source may be filled in the first and second air gaps by a pressure applied thereto.

The color source may include first particles having a first size and second particles having a second size different from the first size and mixed with the first particles.

The first size may be smaller than the second size, and the first air gaps may be filled with the first particles by the pressure.

According to an aspect of embodiments of the present invention, a window member may be integrally formed with the bezel. Therefore, a step difference between the bezel area and the transmission area may be reduced, and a bubble or delamination may be prevented or substantially prevented from occurring even though the window member is coupled to other elements.

In addition, since the color is provided to the base member using various coating processes, the bezel area may be easily defined in the window member. Thus, the elements may be prevented or substantially prevented from being damaged even though the bezel area is formed.

BRIEF DESCRIPTION OF THE DRAWINGS

The above and other aspects of the present disclosure will become more readily apparent by reference to the following detailed description when considered in conjunction with the accompanying drawings, wherein.

DETAILED DESCRIPTION

Herein, some exemplary embodiments of the present invention will be described in further detail with reference to the accompanying drawings. The present disclosure may, however, be embodied in different forms and should not be construed as limited to the embodiments set forth herein.

Figure 1:
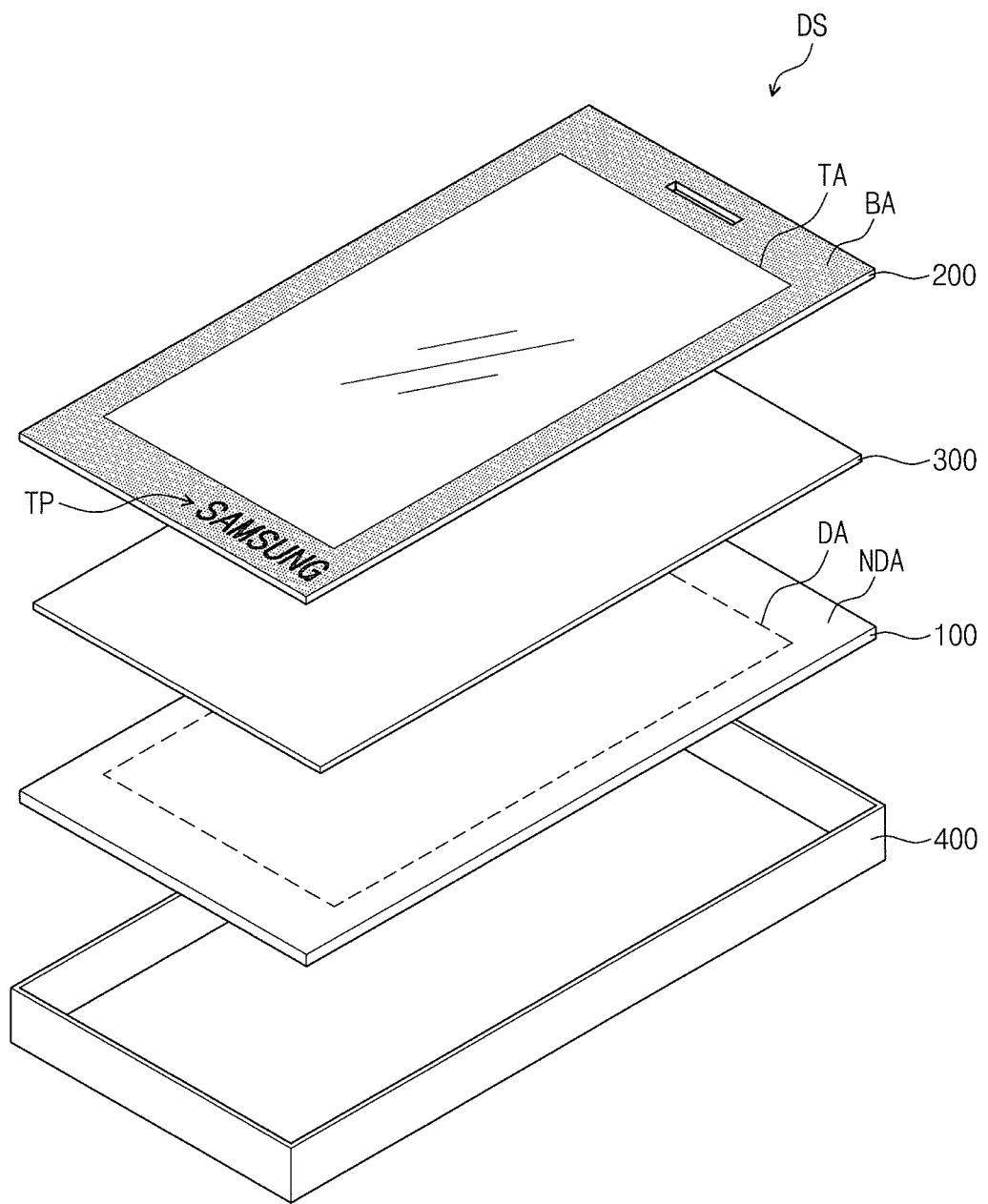
FIG. 1 is an exploded perspective view showing a display device according to an exemplary embodiment of the present disclosure.
Figure 2:
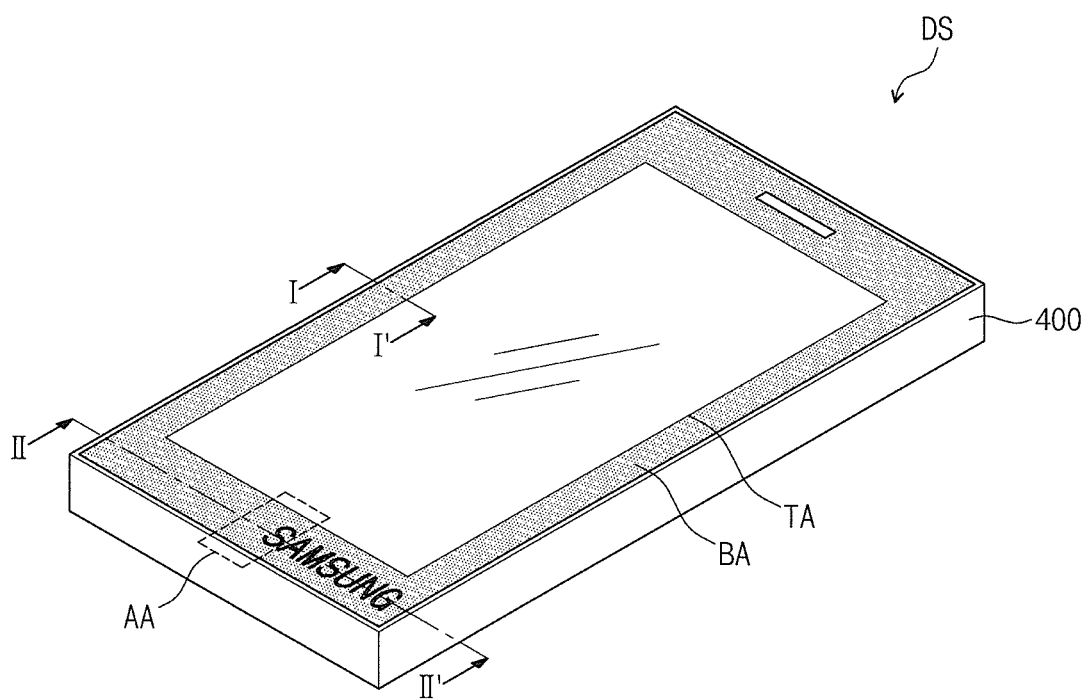
FIG. 2 is a perspective view of the display device of FIG. 1, shown in an assembled state.
Figure 3:
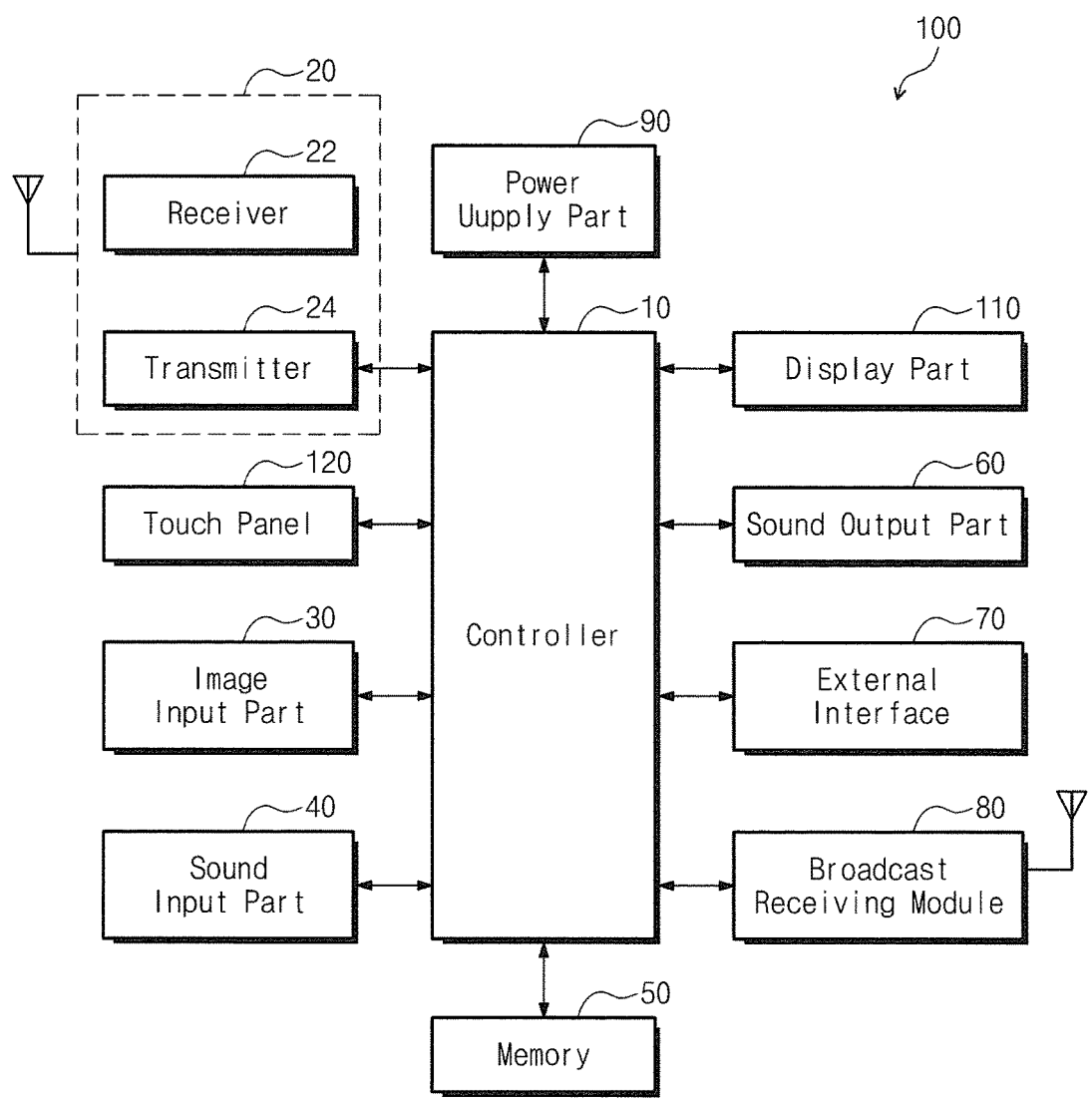
FIG. 3 is a block diagram of a display member of the display device of FIG. 1.

FIG. 1 is an exploded perspective view showing a display device DS according to an exemplary embodiment of the present disclosure; FIG. 2 is a perspective view of the display device DS, shown in an assembled state; and FIG. 3 is a block diagram of a display member of the display device DS.

Referring to FIGS. 1 and 2, according to an embodiment, the display device DS includes a display member 100, a window member 200, an adhesive member 300, and an accommodating member 400.

The display member 100 includes a display area DA and a peripheral area NDA, which are distinguished from each other when viewed in a plan view. The display area DA is defined at a central portion of the display member 100.

The peripheral area NDA is defined adjacent to the display area DA. The peripheral area NDA has a frame shape to surround the display area DA when viewed in a plan view. However, the peripheral area NDA is not limited to a specific shape, so long as the peripheral area NDA is disposed adjacent to the display area DA.

Referring to FIG. 3, according to an embodiment, the display member 100 includes a variety of elements to carry out a function of the display device DS. In an embodiment, for instance, the display member 100 includes a display panel 110, a touch panel 120, a controller 10, a wireless communication module 20, an image input part 30, a sound input part 40, a memory 50, a sound output part 60, an external interface 70, a broadcast receiving module 80, and a power supply part 90.

The display panel 110 generates the image in response to electrical signals. The display panel 110 may include, but is not limited to, an organic light emitting display panel, a liquid crystal display panel, a plasma display panel, an electrophoretic display panel, or an electrowetting display panel.

The touch panel 120 calculates coordinate information about an external input. The external input indicates an input induced by a stylus pen or a user's finger, for example. Although not shown in the figures, the external input occurs on the window member 200.

The touch panel 120 may be, but is not limited to, a resistive overlay type touch panel or a capacitive overlay type touch panel. In another embodiment, the touch panel 120 may be omitted from the display device.

The controller 10 controls an overall operation of the display device DS. For instance, the controller 10 may perform control and processing relevant to a voice call, a data communication, a video conference and/or the like. In addition, the controller 10 may control an operation of the touch panel 120. For instance, the controller 10 may control the display panel 110, the image input part 30, the memory 50, and the sound output part 60 on the basis of the coordinate information provided from the touch panel 120.

The wireless communication module 20 transmits and receives a wireless signal to and from a mobile communication base station through an antenna. For instance, the wireless communication module 20 may transmit and receive sound data, text data, image data, and control data. The wireless communication module 20 includes a transmitter 24 that modulates a signal to be transmitted, and a receiver 22 that demodulates a signal to be received.

The image input part or module 30 processes an image signal to convert the image signal to image data such that the image data are displayed through the display panel 110. The sound input part or module 40 receives an external sound signal through a microphone and converts the sound signal to electric voice data in a call mode, a record mode, or a voice recognition mode.

The sound input module 40 may perform various noise removal algorithms to remove noises generated when the external sound signal is input to the sound input module 40.

The sound output part or module 60 converts the sound data provided from the wireless communication module 20 or the sound data stored in the memory 50 and outputs the converted sound data.

The external interface 70 serves as an interface between a mobile terminal and external devices, such as a wired/wireless headset, an external charger, a wired/wireless data port, a card socket (e.g., a memory card and an SIM/UIM card), etc.

The broadcast receiving module 80 receives a broadcast signal transferred through a satellite or a ground wave and converts the broadcast signal to broadcast data that may be output to the sound output module 60 and the display panel 110.

The display device DS has been described in the case where the display device DS is a mobile electronic device, e.g., a mobile phone, but it should not be limited thereto or thereby. For instance, in the case where the display device DS is a large-sized device that is fixedly provided at a specific place or a device operated on the basis of a wired communication, at least one of the elements shown in FIG. 3 may be omitted.

Referring to FIGS. 1 and 2 again, the window member 200 protects the display member 100 and improves an aesthetic design of the display member 100. In the present exemplary embodiment, the window member 200 is coupled to the display member 100 by the adhesive member 300, but it should not be limited thereto or thereby. In another embodiment, the display member 100 may be accommodated in the accommodating member 400 by another element and the window member may be coupled to only the accommodating member 400 to define an appearance of the display device DS.

The window member 200 is disposed on the display member 100 to cover the display member 100. In an embodiment, the window member 200 has a substantially hexahedron shape including a front surface configured to face a user, a rear surface facing the display member 100, and a plurality of side surfaces connecting the front surface and the rear surface.

The window member 200 includes a transmission area TA and a bezel area BA when viewed in a plan view.

The transmission area TA is overlapped with the display area DA. The transmission area TA transmits the light to allow the image displayed on the display area DA to be perceived from the outside.

The bezel area BA is overlapped with the peripheral area NDA. The bezel area BA is disposed adjacent to the transmission area TA to define the transmission area TA. The bezel area BA blocks the light passing through the peripheral area NDA to allow the peripheral area NDA not to be perceived from the outside.

In the window member 200, the bezel area BA has at least one color. The bezel area BA may be used for a factor in aesthetic design of the display device DS. Accordingly, the user perceives the image generated by the display member 100 through the transmission area TA and perceives the color of the bezel area BA through the bezel area BA.

In an embodiment, a color pattern TP may be defined in the bezel area BA. The color pattern TP has a color different from that of the bezel area BA. Therefore, the color pattern TP, e.g., shown in the word of "SAMSUNG," is distinguishable from the other area of the bezel area BA. Further detailed description of the window member 200 will be described later.

The adhesive member 300 is disposed between the display member 100 and the window member 200. The adhesive member 300 couples the display member 100 and the window member 200.

The adhesive member 300 includes an adhesive material having high transmittance. For instance, the adhesive member 300 includes an optical clear adhesive (OCA), a pressure sensitive adhesive (PSA), or an optical clear resin (OCR).

Thus, although the adhesive member 300 is disposed to overlap with the display area DA and the transmission area TA, the adhesive member 300 does not exert influence on a visibility of the image. As an area in which the adhesive member 300 is overlapped with the display member 100 and the window member 200 increases, a coupling force between the display member 100 and the window member 200 increases.

Although not shown in the figures, the adhesive member 300 may be disposed to overlap with only the bezel area BA. In this case, since the adhesive member 300 is not overlapped with the display area DA, the visibility of the image may be improved. In an embodiment, the adhesive member 300 may be omitted from the display device DS.

The accommodating member 400 defines a predetermined inner space therein. The display member 100 and the window member 200 are accommodated in an inner space of the accommodating member 400. The accommodating member 400 and a cover member 500 (see FIG. 7A) may be coupled to each other to define the appearance of the display device DS.

In an embodiment, the accommodating member 400 includes a predetermined protruding portion 400-P defined thereon. The protruding portion 400-P supports the window member 200. Therefore, the accommodating member 400 stably accommodates elements contained therein and having a step difference.

In another embodiment, the protrusion portion 400-P may be omitted. In this case, the display member 100 has a same size and shape as those of the window member 200 when viewed in a plan view. A front surface of the adhesive member 300 is coupled to the display member 100.

Although not shown in the figures, elements used to drive the display device DS and apply a source voltage to the display device DS may be accommodated in the inner space of the accommodating member 400. The display device DS according to the present exemplary embodiment should not be limited thereto or thereby and may have a variety of structures.

Figure 4A:
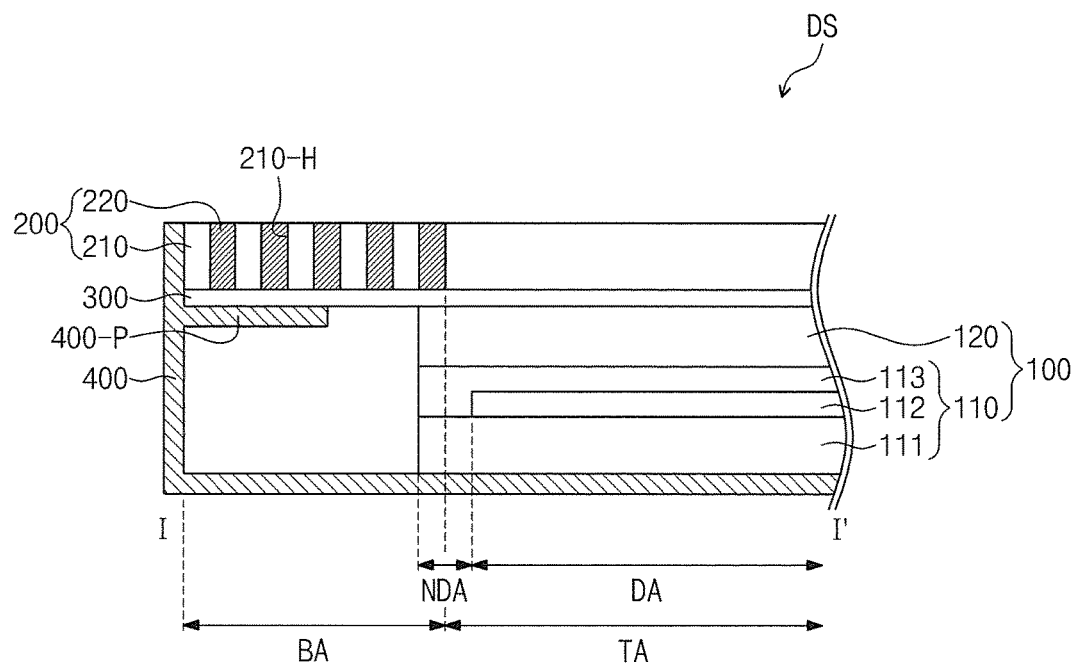
FIG. 4A is a cross-sectional view taken along the line I-I' of FIG. 2.
Figure 4B:
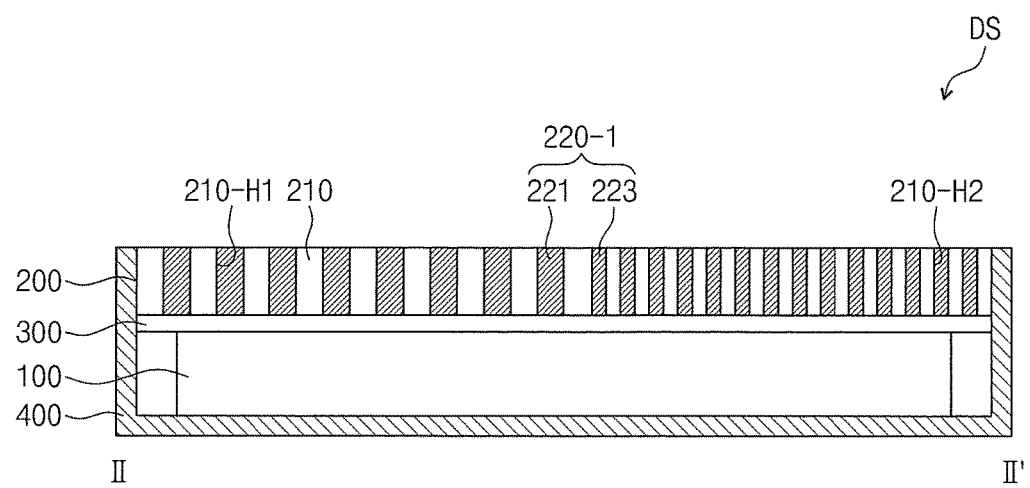
FIG. 4B is a cross-sectional view taken along the line II-II' of FIG. 2.
Figure 4C:
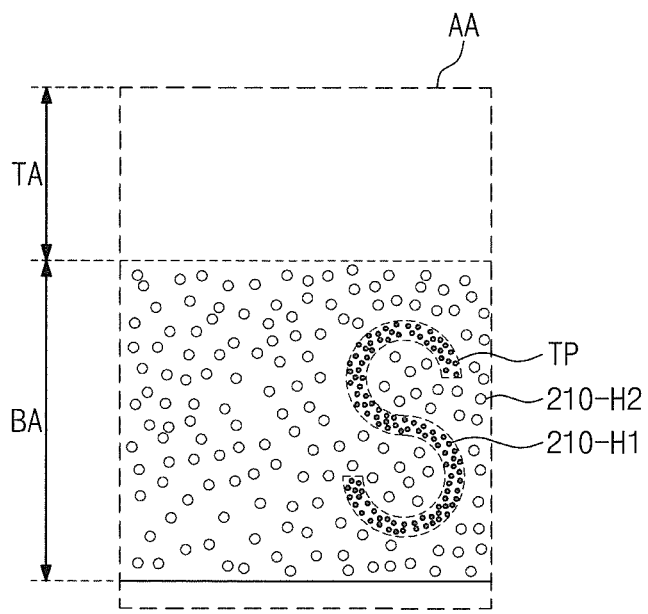
FIG. 4C is a partial enlarged plan view showing a region "AA" of FIG. 2.

FIG. 4A is a cross-sectional view taken along the line I-I' of FIG. 2; FIG. 4B is a cross-sectional view taken along the line II-II' of FIG. 2; FIG. 4C is a partial enlarged plan view showing a region "AA" of FIG. 2; and FIG. 4D is a cross-sectional view showing a portion of a display device according to an exemplary embodiment of the present disclosure.

For convenience of explanation, a specific configuration of the display member 100 is omitted in FIG. 4B. In addition, FIG. 4D shows portions corresponding to those of FIG. 4A. Hereinafter, the display device DS according to the present exemplary embodiment will be described in further detail with reference to FIGS. 4A to 4D.

Figure 4D:
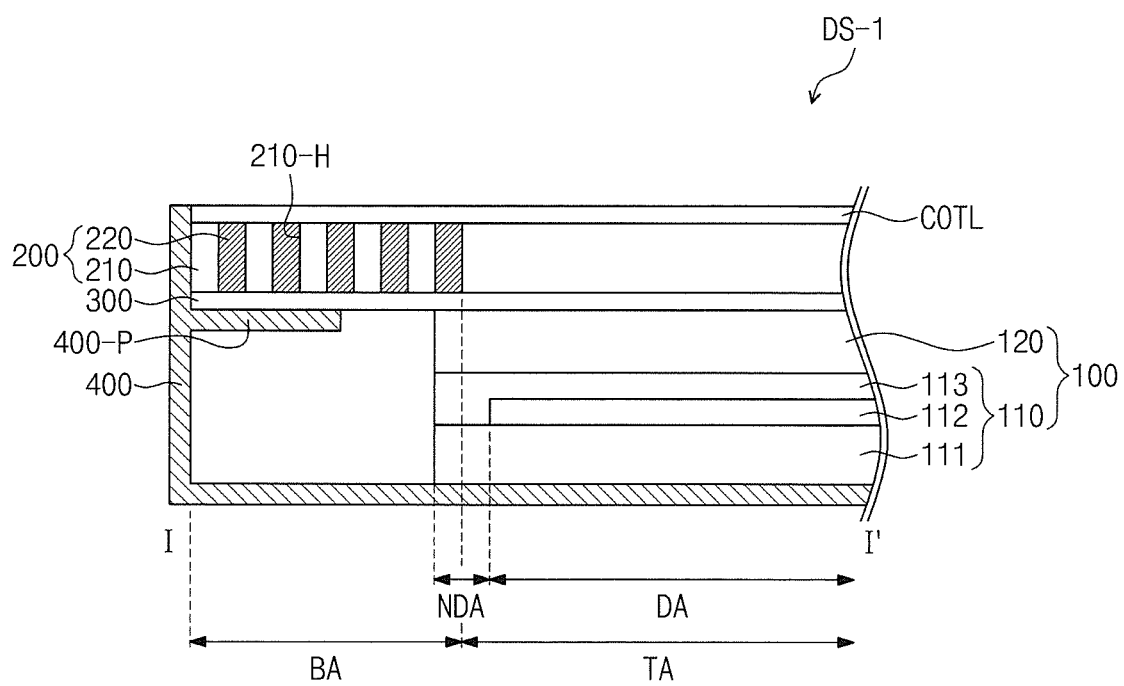
FIG. 4D is a cross-sectional view showing a portion of a display device according to an exemplary embodiment of the present disclosure.

FIGS. 4A and 4D show a structure in which the display panel 110 and the touch panel 120 are stacked on one another. The display panel 110 includes a base layer 111, a pixel layer 112, and an encapsulation layer 113.

The base layer 111 includes an insulating material. For instance, in one embodiment, the base layer 111 includes a glass or plastic material, but embodiments are not limited thereto or thereby.

The pixel layer 112 is disposed on the base layer 111. The pixel layer 112 includes a plurality of pixels. Although not shown in the figures, each pixel includes at least one thin film transistor and a display element.

The display element may be, but is not limited to, an organic light emitting element, a liquid crystal capacitor, an electrophoretic element, or a conductive ink. In the present exemplary embodiment, the organic light emitting display panel including the organic light emitting element will be described as the display panel 110.

The pixels generate lights in response to electrical signals to display the image. Accordingly, an area in which the pixel layer 112 is disposed corresponds to the display area DA in which the image is displayed.

The encapsulation layer 113 is disposed on the base layer 111 to cover the pixel layer 112. The encapsulation layer 113 seals the pixel layer 112 to protect the pixel layer 112 from external impacts.

The encapsulation layer 113 may be formed of a material having high transmittance to allow the light generated by the pixel layer 112 to be perceived from the outside of the display member 100. In an embodiment, the encapsulation layer 113 may have a stack structure of a plurality of organic layers and/or inorganic layers. Therefore, the encapsulation layer 113 is provided in a thin film shape or the like, and thus flexibility of the display panel 110 is improved.

In another embodiment, the encapsulation layer 113 may be, but is not limited to, a glass substrate or a plastic substrate. Thus, rigidity of the encapsulation layer 113 is improved and reliability of the display panel 110 is improved. Meanwhile, the display panel 110 may further include a predetermined sealing member to couple the encapsulation layer 113 to the base layer 111.

In an embodiment, the touch panel 120 is directly disposed on the encapsulation layer 113. In this case, the touch panel 120 may be formed by directly depositing a plurality of touch patterns on the encapsulation layer 113, or the touch panel 120 may be attached on the encapsulation layer 113 after being separately formed.

Although not shown in the figures, the touch panel 120 may be integrally formed with the display panel 110 as a single unitary and individual unit. In this case, the touch panel 120 is disposed inside the display panel 110. However, the touch panel 120 is not be limited to a specific embodiment.

The window member 200 includes a base member 210 and a color member 220. The base member 210 includes a material having high transmittance.

The base member 210 includes a transparent insulating material. The transparent insulating material means that the material has high light transmittance and is not opaque. As an example, the base member 210 may include, but is not limited to, a plastic substrate of polyimide, polycarbonate, polyethylene terephthalate, or polymethyl methacrylate, or a glass substrate.

The base member 210 includes a plurality of air gaps 210-H defined therein. The air gaps 210-H are defined in an area of the window member 200, which is to be the bezel area BA. Accordingly, the bezel area BA corresponds to the area of the window member 200 in which the air gaps 210-H are defined.

The color member 220 is disposed in the air gaps 210-H. The color member 220 defines the color of the bezel area BA. The bezel area BA may have a variety of colors due to the color member 220.

The color member 220 represents a color (e.g., a predetermined color) and may include any of various materials. For instance, the color member 220 may include an organic and/or inorganic pigment(s), dye, or a mixture of pigment and dye.

In addition, the color member 220 may include metal particles each having a nano-level size, which causes a surface plasmon resonance in response to a light incident thereto to express a color (e.g., a predetermined color). The metal particles are formed of a metal material having high reflectance, e.g., silver, gold, aluminum, etc.

In the case where the color member 220 includes the metal particles, the metal particles have a color different from that of the bezel area BA. The metal particles control the color using the surface plasmon resonance in accordance with their size and scatter the light incident thereto to represent various colors. However, the color member 220 should not be limited to the above-mentioned embodiment.

Referring to FIGS. 4B and 4C, in an embodiment, the air gaps 210-H have different sizes and include a plurality of first air gaps 210-H1 and a plurality of second air gaps 210-H2. The first air gaps 210-H1 have a size different from that of the second air gaps 210-H2. For instance, each first air gap 210-H1 has a cross-sectional area different from a cross-sectional area of each second air gap 210-H2. In the present exemplary embodiment, the first air gaps 210-H1 correspond to the air gaps 210-H shown in FIG. 4A.

In FIGS. 4B and 4C, an average cross-sectional area of the first air gaps 210-H1 is greater than an average cross-sectional area of the second air gaps 210-H2, but it should not be limited thereto or thereby. That is, the average cross-sectional of the first air gaps 210-H1 may be smaller than the average cross-sectional area of the second air gaps 210-H2.

Arrangements of the first and second air gaps 210-H1 and 210-H2 are not limited to a specific arrangement. The first and second air gaps 210-H1 and 210-H2 may be regularly or randomly arranged. The first air gaps 210-H1 may be spaced apart from each other at different intervals, and the second air gaps 210-H2 may be spaced apart from each other at different intervals.

In an embodiment, the bezel area BA may include a logo area and a background area. The logo area may include the color pattern TP defined therein, which serves as a logo. The background area may correspond to the bezel area BA except for the logo area.

In the present exemplary embodiment, the background area is defined by the first air gaps 210-H1. Therefore, the first air gaps 210-H1 are distributed in the entire area of the bezel area BA. The first air gaps 210-H1 define a size and a shape of the background area and a color member 220-1 filled in the first air gaps 210-H1 defines the color of the background area.

The logo area or the color pattern TP are defined by the second air gaps 210-H2. Thus, the second sir gaps 210-H2 are densely arranged in a portion of the bezel area BA. The second air gaps 210-H2 define a size and a shape of the color pattern TP and the color member 220-1 filled in the second air gaps 210-H2 defines the color of the color pattern TP. In the bezel area BA, the size of the area in which the first air gaps 210-H1 are arranged may be greater than the size of the area in which the second air gaps 210-H2 are arranged.

The color member 220-1 disposed in the first air gaps 210-H1 represents a color different from a color represented by the color member 220-1 disposed in the second air gaps 210-H2. That is, the color member 220-1 includes a first color member 221 and a second color member 223.

For instance, the first color member 221 representing a first color is disposed in the first air gaps 210-H1, and the second color member 223 representing a second color is disposed in the second air gaps 210-H2. Therefore, the second air gaps 210-H2 are distinguished from the area in which the first air gaps 210-H1 are arranged in the bezel area BA, and thus define the color pattern TP.

In another embodiment, color members having the same color may be disposed in air gaps having different sizes or color members having different colors may be disposed in air gaps having the same size. The window member 200 according to the present disclosure is not limited to the above-mentioned embodiments.

As described above, the display device DS includes the base member 210 in which the air gaps 210-H are defined and the color member 220, and thus the bezel having the predetermined color may be easily realized in the single layer. That is, a portion of the window member 200, which corresponds to the bezel area BA, may have substantially the same thickness as a portion of the window member 200, which corresponds to the transmission area TA.

Accordingly, the adhesive member 300 may be disposed on the rear surface of the window member 200 without having a step difference between the bezel area BA and the transmission area TA. Since a step difference does not exist between the bezel area BA and the transmission area TA, the adhesive member 300 is provided with a flat surface and substantially couples the window member 200 and the display member 100.

Although not shown in the figures, although the display member 100 has substantially the same shape as the window member 200 when viewed in a plan view, the display member 100 may be securely coupled to the window member 200. Thus, the display member 100 or the window member 200 may be prevented or substantially prevented from being separated from each other.

As described above, since a separate decoration layer is not needed to be disposed on a surface of the base member 210, and the color member is disposed in the base member 210, the bezel of the display device DS may be integrally formed with the base member as a single unitary and individual unit. Accordingly, the thickness of the window member may be reduced and layers of the base member 210 may be prevented or substantially prevented from being separated from each other.

In an embodiment, as shown in FIG. 4D, a display device DS-1 may include a window member 200-1 further including an insulating layer COTL. The insulating layer COTL is disposed on the base member 210 to cover at least the bezel area BA. In the present exemplary embodiment, the insulating layer COTL may be a coating layer to cover an entire surface of the base member 210.

The insulating layer COTL protects a front surface of the base member 210. Therefore, the insulating layer COTL may be a functional layer, such as a hard coating layer having high strength, an anti-soil coating layer protecting the display device DS-1 from external contaminants, a water-repellent coating layer preventing or substantially preventing moisture from entering the display device DS-1, etc.

As described above, since the window member 200-1 further includes the insulating layer COTL, a separate cover member may be omitted, a manufacturing process may be simplified, and a manufacturing cost may be reduced.

Figure 5A:
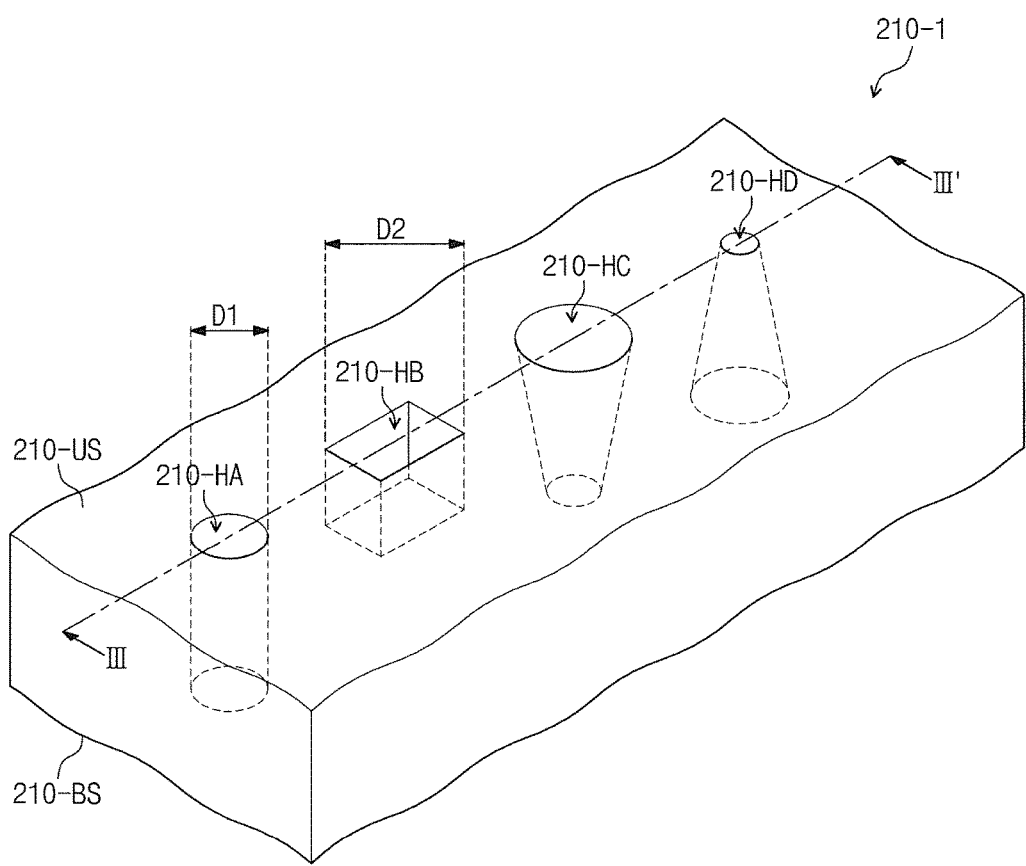
FIG. 5A is a projection perspective view showing a base member according to an exemplary embodiment of the present disclosure.
Figure 5B:
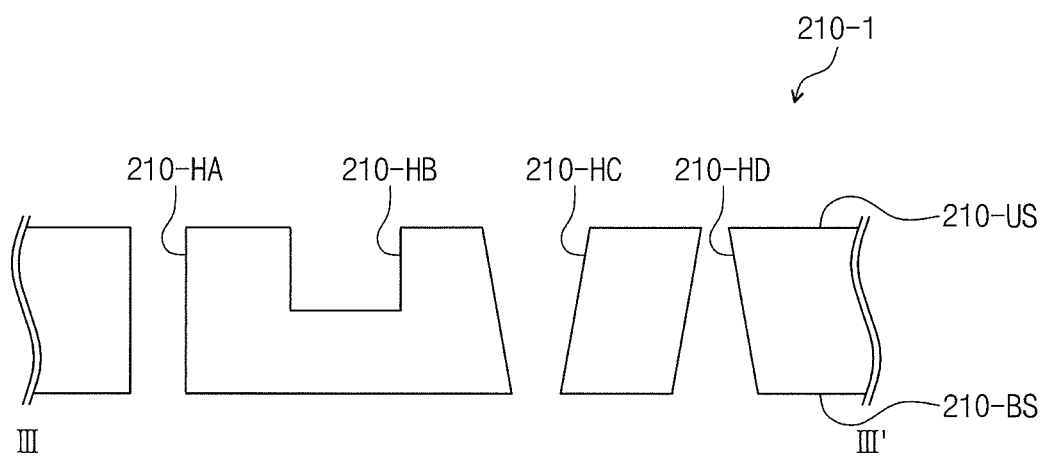
FIG. 5B is a cross-sectional view taken along the line III-III' of FIG. 5A.

FIG. 5A is a projection perspective view showing a base member 210-1 according to an exemplary embodiment of the present disclosure; and FIG. 5B is a cross-sectional view taken along the line III-III' of FIG. 5A. The base member 210-1 will be described in further detail with reference to FIGS. 5A and 5B.

Referring to FIGS. 5A and 5B, the base member 210-1 includes air gaps defined therein to have various shapes and sizes. Accordingly, the base member 210-1 may serve as a porous member, e.g., a sponge. The air gaps are defined to penetrate through the base member 210-1 or are defined as recesses in at least one surface of the base member 210-1.

The shape of each air gap is determined by a cross-sectional area of the air gap when viewed from a front surface 210-US of the base member 210 and a variation in cross-sectional area of the air gap in a thickness direction of the base member 210-1, which is defined from the front surface 210-US to a rear surface 210-BS of the base member 210-1. FIG. 5A shows an air gap 210-HA having a cylindrical shape, an air gap 210-HB having a prism shape, and air gaps 210-HC and 210-HD having truncated cone shapes.

Each of the air gap 210-HA having the cylindrical shape and the air gap 210-HB having the prism shape has a constant cross-sectional area in the thickness direction of the base member 210-1. The air gap 210-HA having the cylindrical shape and the air gap 210-HB having the prism shape are distinguished from each other by the cross-sectional shape thereof.

Each of the air gaps 210-HC and 210-HD having the truncated cone shapes has a cross-sectional area varying along the thickness direction of the base member 210-1. The cross-sectional area of the air gaps 210-HC and 210-HD having the truncated cone shapes gradually decreases along the thickness direction of the base member 210-1 from the front surface 210-US or gradually increases along the thickness direction of the base member 210-1 from the front surface 210-US.

In an embodiment, portions of the front surface 210-US, which correspond to air gaps, are removed, such that at least one side surface of the color member according to the present exemplary embodiment is exposed through the front surface 210-US. An average cross-sectional size of each air gap is determined depending a size of an opening defined by the removed portion of the front surface 210-US. Thus, the average cross-sectional size of each air gap is determined depending on a diagonal length of the opening.

For instance, since the air gap 210-HA having the cylindrical shape defines the opening with a circular shape on the front surface 210-US, an average cross-sectional size D1 of the air gap 210-HA is determined by a diameter of the circular shape. Since the air 210-HB having the prism shape defines the opening with a polygonal shape, an average cross-sectional size D2 of the air gap 210-HB is determined by a diagonal line of the polygonal shape.

The size of the air gap is in a range equal to or greater than about 10 nm and equal to or smaller than about 1000 nm. As the size of the air gap increases, the air gap is easily perceived by the user, and thus an aesthetic design of the display device is damaged. On the contrary, as the size of the air gap decreases, the color member 220 is difficult to be filled in the air gap or the color of the bezel area BA is difficult to be perceived.

The air gap may be realized in a recess portion recessed from the front surface 210-US or a penetration portion penetrated through the base member 210-1 in accordance with a depth of the air gap. As shown in FIG. 5B, the air gap 210-HA having the cylindrical shape corresponds to the penetration portion since the air gap 210-HA having the cylindrical shape has a depth substantially the same as the thickness of the base member 210-1, and the air gap 210-HB having the prism shape corresponds to the recess portion since the air gap 210-HB having the prism shape has a depth smaller than the thickness of the base member 210-1.

However, the shape of the air gaps is not limited to the above-mentioned shapes.

Figure 6A:
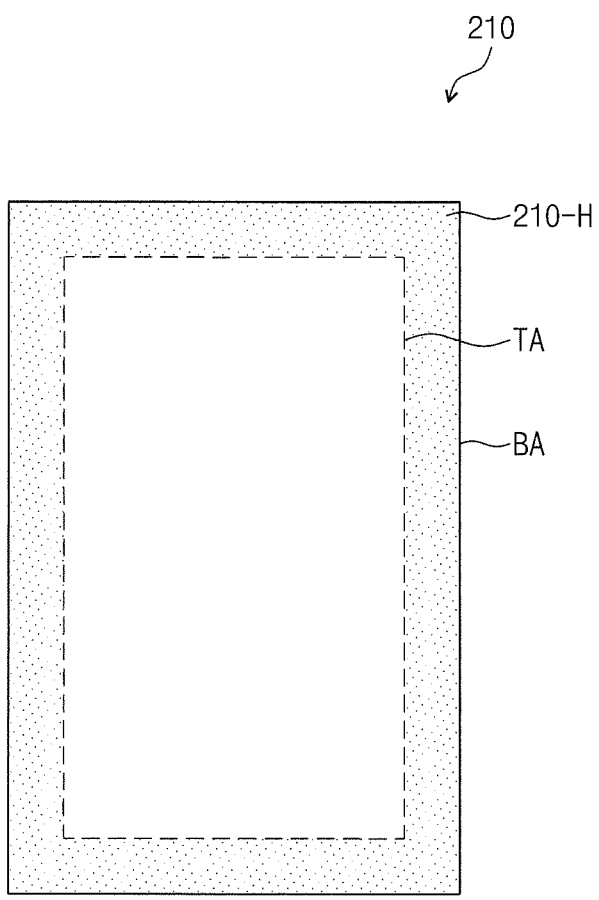
FIG. 6A is a plan view showing a base member according to an exemplary embodiment of the present disclosure.
Figure 6B:
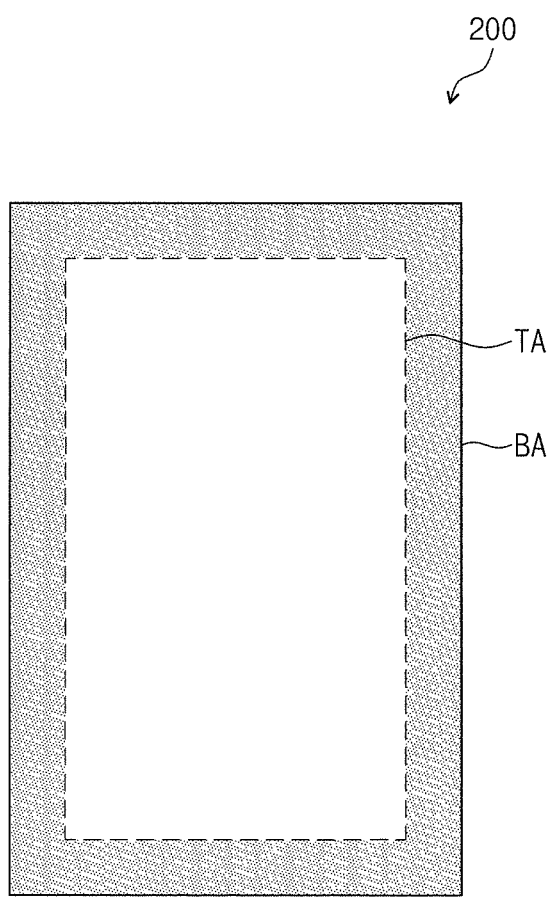
FIG. 6B is a plan view showing a window member according to an exemplary embodiment of the present disclosure.

FIG. 6A is a plan view showing a base member 210 according to an exemplary embodiment of the present disclosure; and FIG. 6B is a plan view showing a window member 200 according to an exemplary embodiment of the present disclosure. For the convenience of explanation, the color pattern TP (refer to FIG. 1) is not shown in FIGS. 6A and 6B.

Referring to FIG. 6A, air gaps 210-H are defined in the base member 210. The air gaps 210-H are distributed in the bezel area BA to define the bezel area BA. Each of the air gaps 210-H has the size equal to or greater than about 10 nm and equal to or smaller than about 1000 nm. For the convenience of explanation, the air gaps 210-H are shown in FIG. 6A, but the air gaps 210-H are difficult to be perceived by the user since each of the air gaps 210-H has a fine size.

Referring to FIG. 6B, when the color member 220 (refer to FIG. 4A) is disposed in the air gaps 210-H, the bezel area BA of the window member 200 has a predetermined color. The base member 210 defines the range of the bezel area BA, and the color member 220 defines the color of the bezel area BA.

In the present exemplary embodiment, the window member 200 is provided to have a single film shape or a plate shape. The window member 200 includes the air gaps 210-H and the color member 220 filled in the air gaps 210-H, and thus the window member 200 provides the flat surface without the step difference between the bezel area BA and the transmission area TA. Accordingly, the bezel may be integrally formed in a single unit. Therefore, an assembling process of the display device is simplified and a manufacturing cost of the display device is reduced.

Figure 7A:
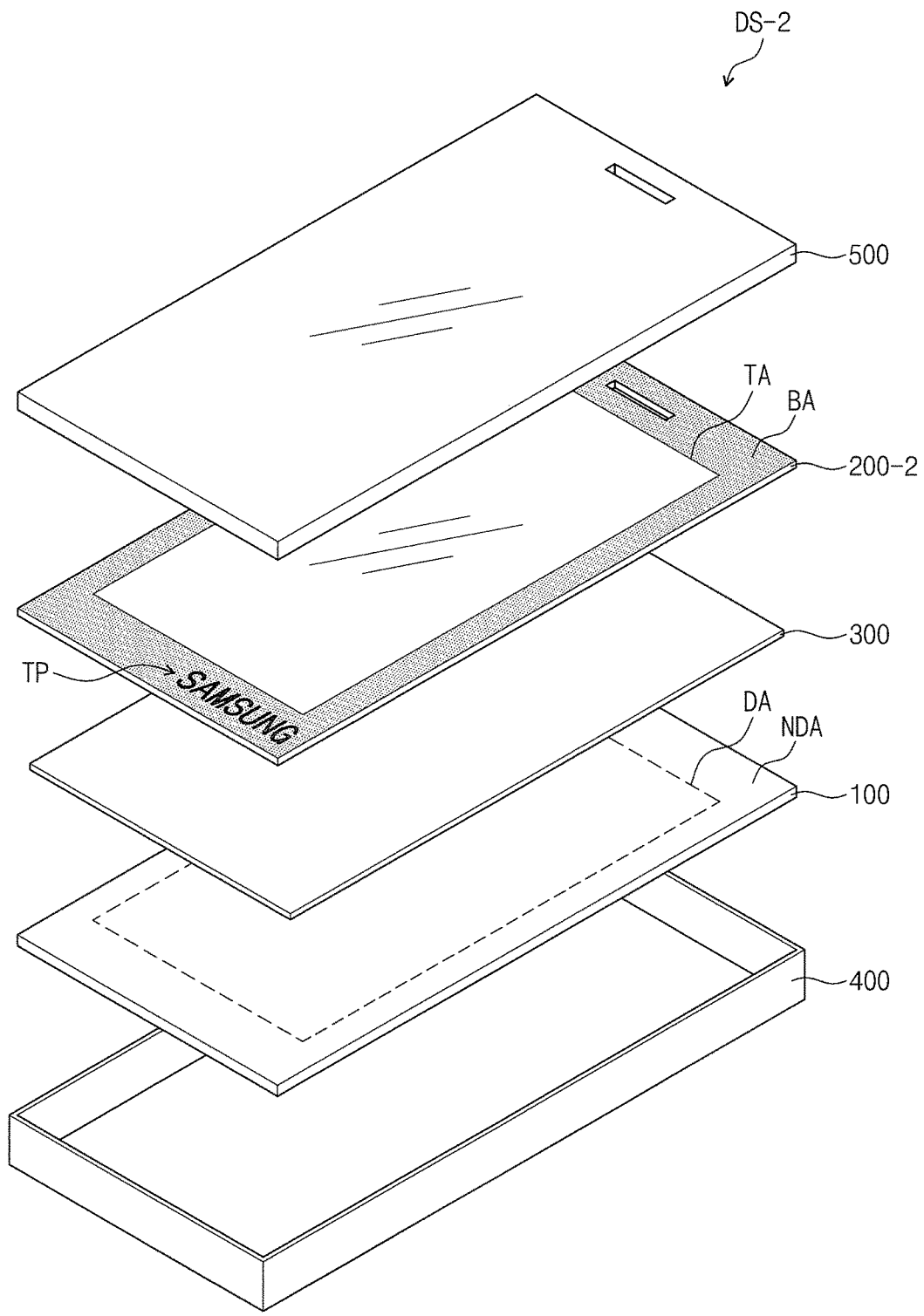
FIG. 7A is an exploded perspective view showing a display device according to an exemplary embodiment of the present disclosure.
Figure 7B:
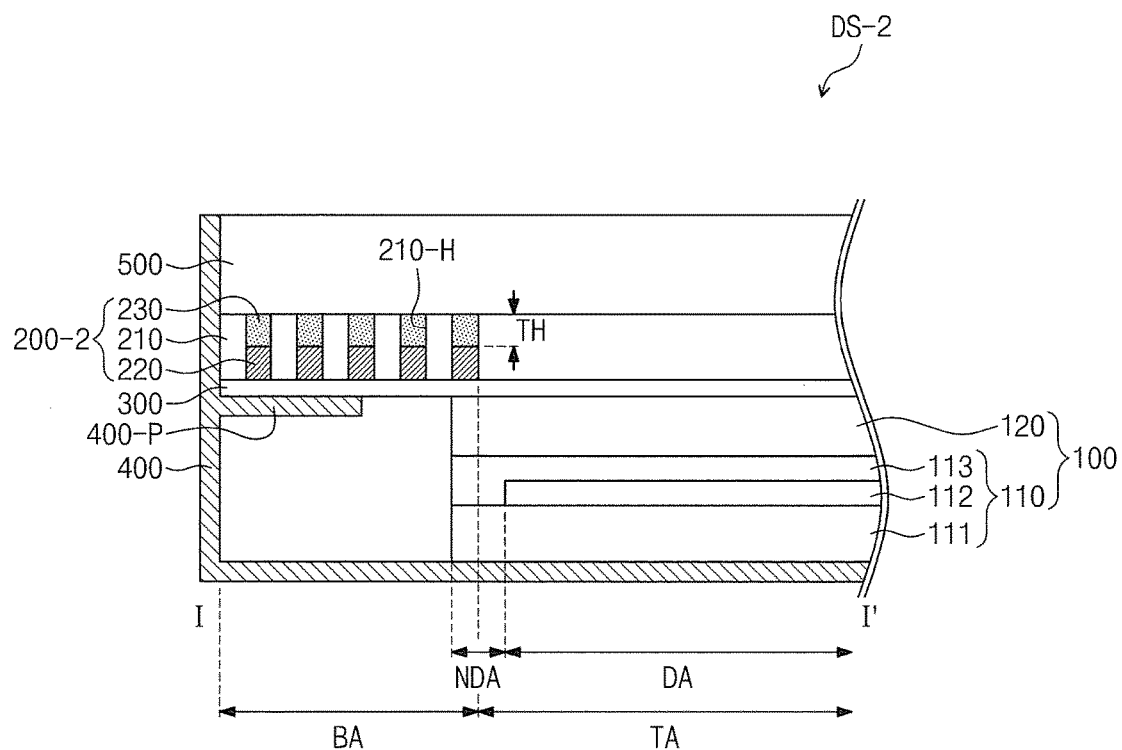
FIG. 7B is a cross-sectional view showing a portion of the display device shown in FIG. 7A.
Figure 8:
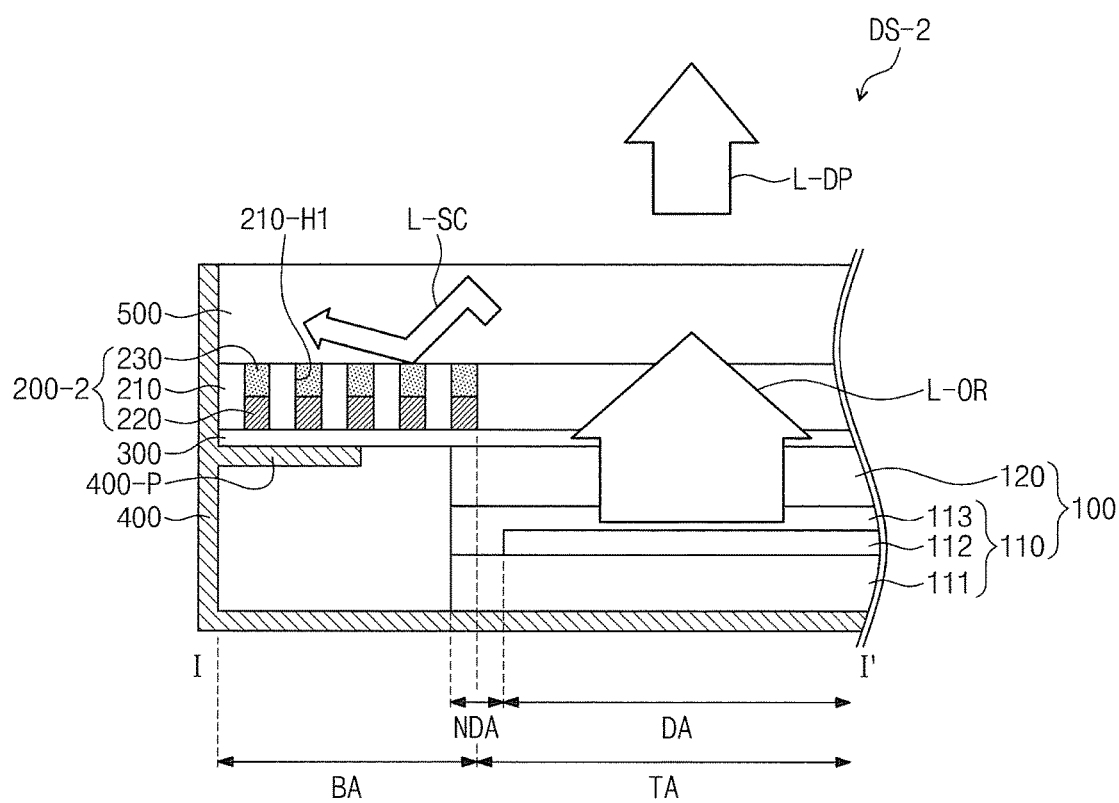
FIG. 8 is a cross-sectional view showing an optical path of the display device shown in FIG. 7A.

FIG. 7A is an exploded perspective view showing a display device DS-2 according to an exemplary embodiment of the present disclosure; FIG. 7B is a cross-sectional view showing a portion of the display device DS-2 shown in FIG. 7A; and FIG. 8 is a cross-sectional view showing an optical path of the display device DS-2 shown in FIG. 7A. The display device DS-2 will be described in further detail with reference to FIGS. 7A, 7B, and 8.

For the convenience of explanation, FIGS. 7B and 8 show an area corresponding to the display device DS shown in FIG. 4A. The display device DS-2 shown in FIGS. 7A, 7B, and 8 includes substantially the same structures as those of the display device DS shown in FIG. 1 except for a window member 200-2. In FIGS. 7A, 7B, and 8, the same reference numerals denote the same elements in FIGS. 1 to 6B, and thus detailed descriptions of the same elements will be omitted.

The window member 200-2 further includes a filling member 230. The filling member 230 is disposed in the air gaps 210-H.

The color member 220 is partially filled in each of the air gaps 210-H. The filling member 230 is filled in a portion of each of the air gaps 210-H which is not filled with the color member 220. Accordingly, the air gaps 210-H are filled with the color member 220 and the filling member 230.

The filling member 230 has a refractive index different from a refractive index of the base member 210. In addition, the refractive index of the filling member 230 is lower than a refractive index of a member disposed on and making contact with the filling member 230.

Accordingly, a light incident to the filling member 230 experiences an interface between the filling member 230 and the member making contact with the filling member 230. An optical path of the light experiencing the interface is changed.

In an embodiment, the filling member 230 has a predetermined thickness TH. The thickness TH of the filling member 230 is determined depending on a wavelength of the light incident to the filling member 230.

The thickness TH of the filling member 230 may be greater than the wavelength of the light incident to the filling member 230. For instance, in the case where the wavelength of the light incident to the filling member 230 corresponds to a visible light wavelength area, the thickness TH of the filling member 230 is equal to or greater than about 780 nm.

In the present exemplary embodiment, the filling member 230 is disposed under the cover member 500, and makes contact with a lower surface of the cover member 500. The refractive index of the filling member 230 is lower than the refractive index of the cover member 500. Therefore, the optical interface through which the light experiences may be formed between the filling member 230 and the cover member 500. The light traveling to the filling member 230 after passing through the cover member 500 is reflected by the filling member 230 without passing through the filling member 230 since the light recognizes the filling member 230 as another member.

In an embodiment, the filling member 230 includes a material having a refractive index lower than about 1.5. In an embodiment, for instance, the filling member 230 includes air, an adhesive layer having a low refractive index, or a resin layer having a low refractive index. In one or more embodiments, the filling member 230 may include acrylated fluoro resins, methoxyperfluoro-hexane, tetrafluoroethylene, hexafluoropropylene, vinylidene fluoride, THV, or aerogel, but is not limited thereto or thereby.

The display device DS-2 may further include the cover member 500. The cover member 500 is disposed above the display member 100. The cover member 500 covers at least the bezel area BA. In the present exemplary embodiment, the cover member 500 covers an entire surface of the window member 200-2.

The cover member 500 includes a transparent insulating material having high transmittance to improve visibility of the image displayed in the display area DA.

The cover member 500 protects the display member 100 and the window member 200-1 from external impacts. In addition, in an embodiment, the cover member 500 receives external inputs. Accordingly, the cover member 500 includes a material having a strength (e.g., a predetermined strength).

For instance, the cover member 500 may be, but is not limited to, a transparent plastic substrate or a glass substrate, but it is not limited thereto or thereby. The cover member 500 may include any of various materials having high transmittance.

As shown in FIG. 8, a light L-OR used to realize the image is generated by a pixel layer 112. The light L-OR used to realize the image travels upward and is provided to the user as a light L-DP after passing through the touch panel 120, the adhesive member 300, the window member 200-2, and the cover member 500.

The display member 100 includes a plurality of layers stacked on one another. When the display member 100 becomes thin, a portion of the light L-OR used to realize the image may leak to the peripheral area NDA and the bezel area BA through the touch panel 120, the adhesive member 300, and the window member 200-2.

Therefore, the leaked light L-SC may appear on the display device DS-2. Due to the leaked light L-SC, the visibility of the image may be deteriorated in an area adjacent to the bezel area BA.

As described above, since the window member 200-2 includes the filling member 230, the optical interface is formed between the filling member 230 and the cover member 500. The leaked light L-SC is incident to the filling member 230 having the refractive index lower than that of the cover member 500, and thus the leaked light L-SC is reflected or refracted at an angle greater than that of the light incident to the base member 210.

The filling member 230 guides the leaked light L-SC. Thus, the leaked light L-SC is guided between an upper surface of the cover member 500 and an upper surface of the filling member 230 and travels to an edge of the cover member 500. Accordingly, a light leakage phenomenon of the display device DS-2, which is caused by the leaked light L-SC, may be reduced.

Figure 9:
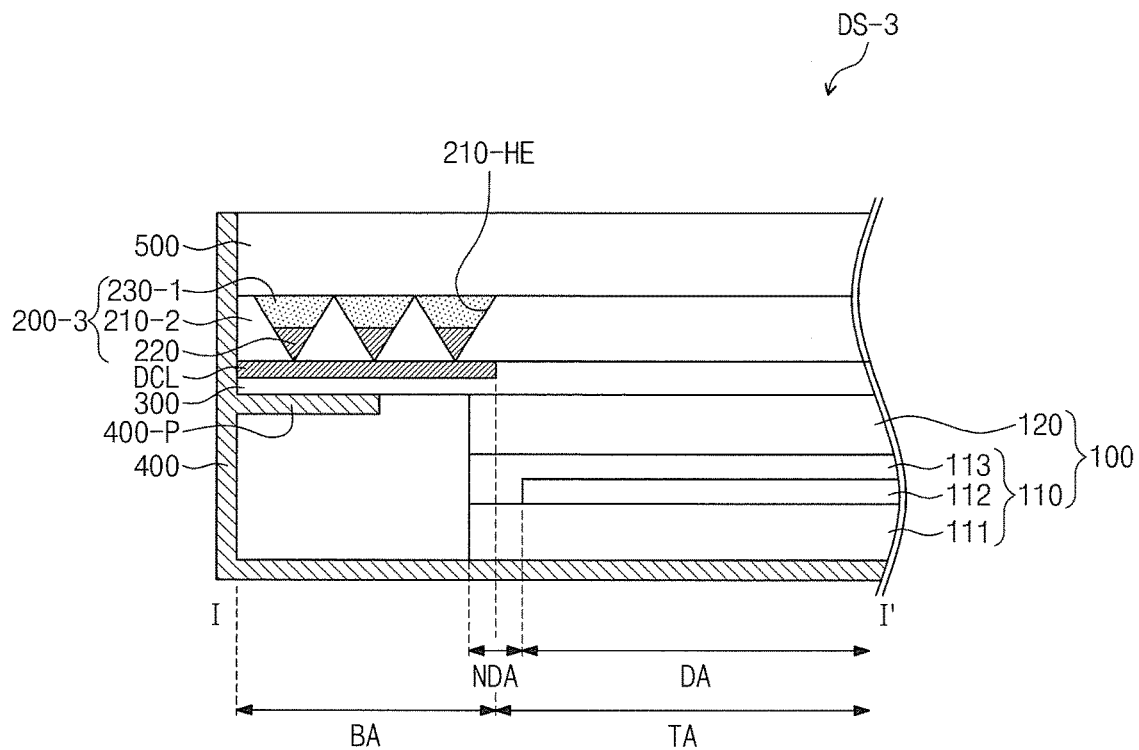
FIG. 9 is a cross-sectional view showing a portion of a display device according to an exemplary embodiment of the present disclosure.

FIG. 9 is a cross-sectional view showing a display device DS-3 according to an exemplary embodiment of the present disclosure. In FIG. 9, the same reference numerals denote the same elements as described above with respect to FIGS. 1 to 8, and thus detailed descriptions of the same elements will be omitted.

Referring to FIG. 9, a window member 200-3 includes a base member 210-2 in which air gaps 210-HE having a cone shape or a prism shape are defined. Each air gap 210-HE has a cross-sectional area decreasing as a distance from a lower surface of the base member 210-2 decreases.

In this case, portions of the air gaps 210-HE, which are filled with the color member 220, are spaced apart from each other at a distance (e.g., a predetermined distance) when viewed in a plan view. Accordingly, the color member 220 has substantially the same structure as that of the structure in which the color member 220 is disposed in air gaps distributed in the bezel area BA.

Portions of the air gaps 210-HE, which are filled with the filling member 230, are spaced apart from each other at a distance smaller than the predetermined distance between the portions filled with the color member 220 or are connected to each other. Therefore, the above-mentioned structure may have substantially the same effect as that of the structure in which the color member 220 is disposed in the distributed air gaps and the filling member 230 guiding the light is disposed in the area of the air gaps corresponding to the bezel area BA.

As described above, the filling member 230 forms the optical interface with the cover member 500. Since the optical interface increases as the area of the filling member 230 increases, a probability in which the leaked light L-SC (refer to FIG. 8) makes contact with the optical interface. Thus, the effect according to the guide of the leaked light L-SC may be increased and the light leakage phenomenon in the display device DS-3 may be effectively prevented or substantially prevented from occurring.

The display device DS-3 may further include an intermediate member. The intermediate member may be disposed between the base member 210 and the adhesive member 300.

In FIG. 9, a decoration layer DCL is shown as an example of the intermediate member. The decoration layer DCL has a predetermined color.

In this case, the decoration layer DCL may have substantially the same color as that of the color member 220. Accordingly, the color of the bezel area BA may be more highly expressed.

The decoration layer DCL may have various colors. For instance, the decoration layer DCL may have a white color having high light reflectance. The reflectance of the color of the decoration layer DCL becomes high, and the light leakage phenomenon of the display device DS-3 is intensified.

The display device DS-3 guides the light such that the light is not incident to the decoration layer DCL or the light reflected by the decoration layer DCL does not travel upward from the bezel area BA since the display device DS-3 further includes a filling member 230-1. Therefore, although the display device DS-3 includes the decoration layer DCL having the white color, the light leakage phenomenon occurring in the display device DS-3 may be reduced.

Figure 10:
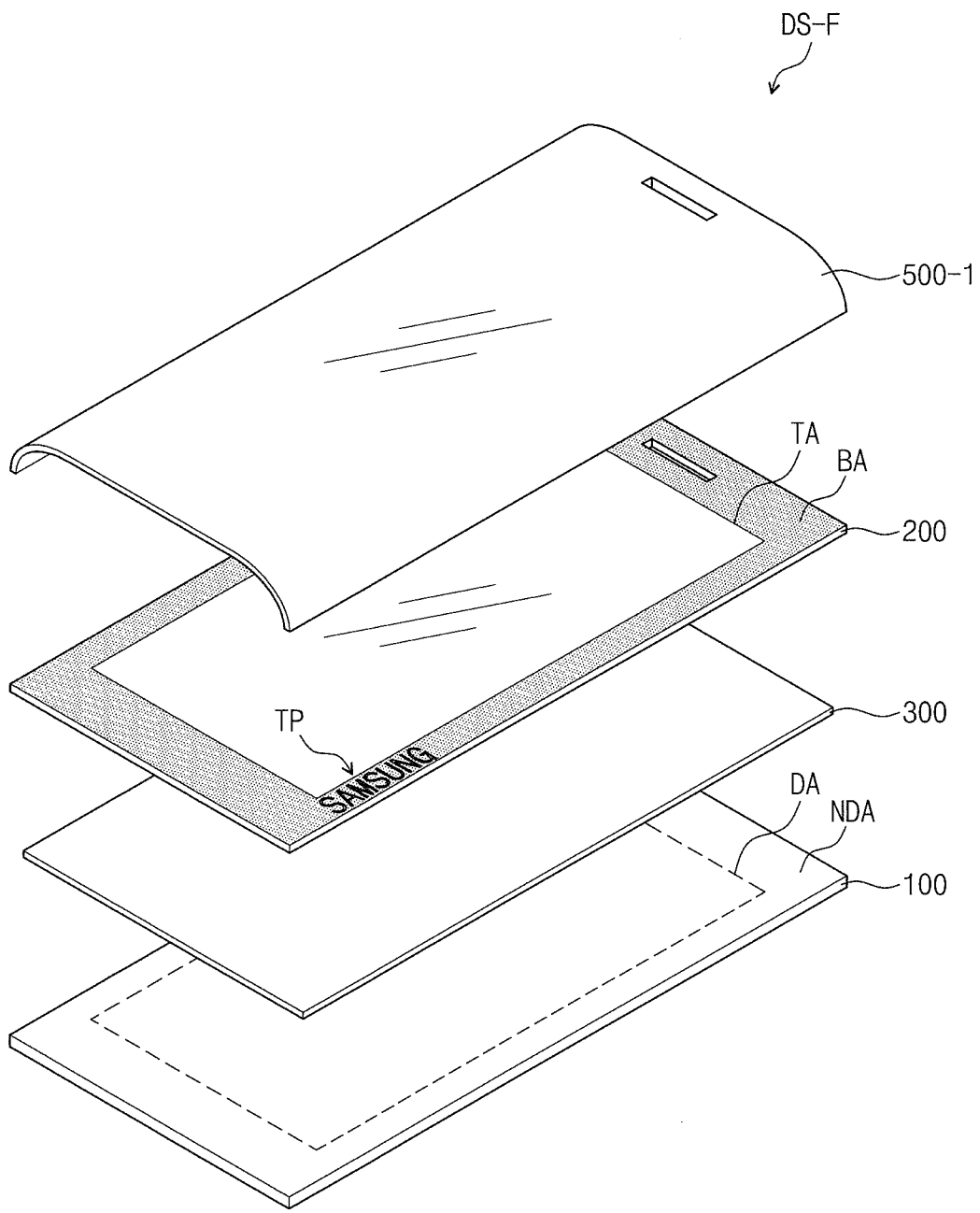
FIG. 10 is an exploded perspective view showing a display device according to an exemplary embodiment of the present disclosure.
Figure 11A:
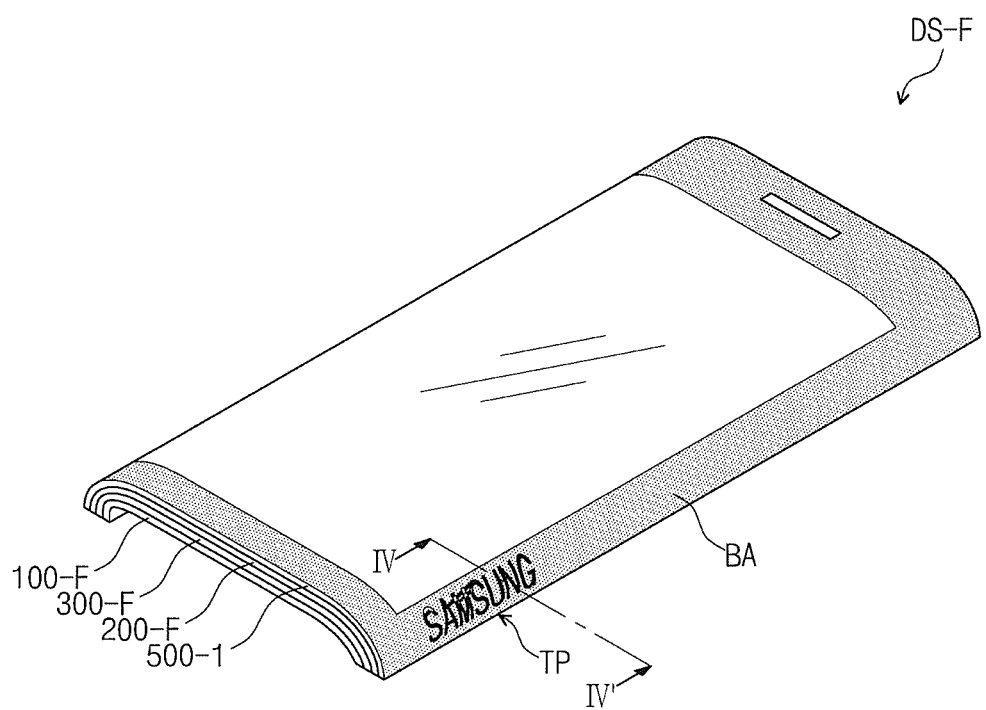
FIG. 11A is a perspective view showing an assembled state of the display device shown in FIG. 10.
Figure 11B:
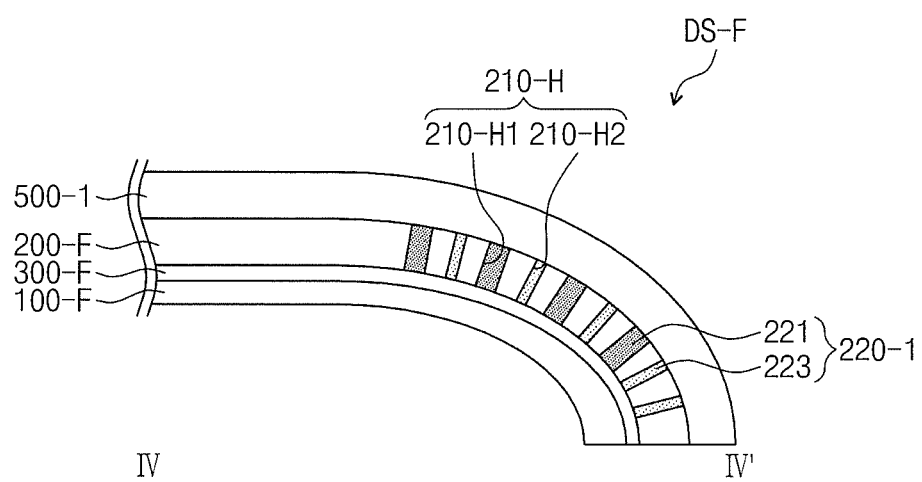
FIG. 11B is a cross-sectional view taken along the line IV-IV' of FIG. 11A.

FIG. 10 is an exploded perspective view showing a display device DS-F according to an exemplary embodiment of the present disclosure; FIG. 11A is a perspective view showing an assembled state of the display device DS-F shown in FIG. 10; and FIG. 11B is a cross-sectional view taken along a line IV-IV' of FIG. 11A. The display device DS-F will be described in further detail with reference to FIGS. 10, 11A, and 11B.

The display device DS-F includes a cover member 500-1 that is bent. For the convenience of explanation, an accommodating member is omitted in FIGS. 10, 11A, and 11B. In FIGS. 10, 11A, and 11B, the same reference numerals denote the same elements in FIGS. 1 to 9, and thus detailed descriptions of the same elements will be omitted.

The cover member 500-1 is bent along a bending axis (e.g., a predetermined bending axis) (not shown). In the present exemplary embodiment, the cover member 500-1 is bent toward a lower side. Accordingly, the bent cover member 500-1 has a curved surface shape.

The cover member 500-1 may be held while being bent. Therefore, the bent cover member 500-1 is not deformed even though external impacts are applied to the bent cover member 500-1 and protects inner elements.

The window member 200 includes a color pattern TP. The color pattern TP is disposed in a portion of the bent cover member 500-1, which has the curved surface shape, of the bezel area BA, but it is not limited thereto or thereby. In another embodiment, the color pattern TP may be omitted from the window member.

The display device DS-F has a bent shape after being assembled. The display device DS-F has a shape corresponding to the bent cover member 500-1.

To this end, the display device DS-F may include elements having flexibility. In further detail, the display member 100 may be flexible display member. The display member 100 and the adhesive member 300 may be bent or curved. Although not shown in the figures, at least a portion of the display area DA (refer to FIG. 1) may be defined in the bent area of the display member 100.

Accordingly, when the display device DS-F is assembled, the display member 100, the window member 200, and the adhesive member 300 of the display device DS-F are bent to correspond to the shape of the bent cover member 500-1. The assembled display device DS-F includes the bent display member 100-F, the bent window member 200-F, and the bent adhesive member 300-F.

The air gaps 210-H may be easily defined in the curved surface. Since the air gaps 210-H are defined in the base member 210, a bending property of the base member 210 may be improved. As the cross-sectional area of the air gaps 210-H increases, a stress generated when the base member 210 is bent or folded may be remarkably reduced.

The color member 220-1 may be deformed to have a shape corresponding to that of the base member 210. Since the color member 220-1 may include fine particles that may be filled in the air gaps 210-H, the bezel area BA having the predetermined color may be easily defined in the curved surface of the window member 200-F.

As described above, since the display device DS-F includes the air gaps 210-H, the stress caused by the bending of the display device DS-F may be reduced, and the display device DS-F may be free from an occurrence of delamination or bubbles. According to the present exemplary embodiment, the air gaps 210-H and the color member 220-1, which are used to define the bezel or the logo, are defined in various areas regardless of the shape of the display device DS-F, and thus the aesthetic design of the display device DS-F may be improved.

FIGS. 12A to 12D are cross-sectional views showing a method of manufacturing a window member according to an exemplary embodiment of the present disclosure.

Figure 12A:
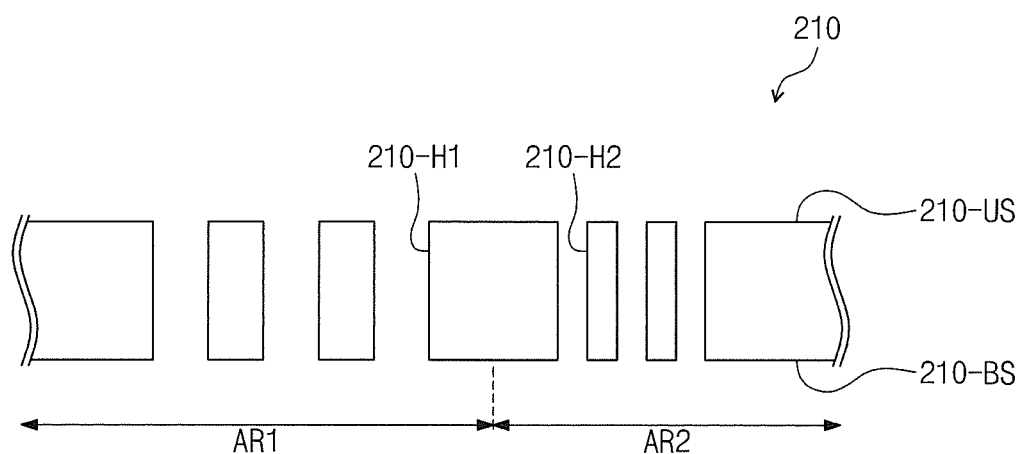
FIGS. 12A to 12D are cross-sectional views showing a method of manufacturing a window member according to an exemplary embodiment of the present disclosure.

Referring to FIG. 12A, the base member 210 in which the air gaps are defined is provided. The air gaps include the first air gaps 210-H1 and the second air gaps 210-H2 having the cross-sectional area different from that of the first air gaps 210-H1. In the present exemplary embodiment, each air gap is formed through the base member 210 as the penetration portion, but it is not limited thereto or thereby. That is, each air gap may be formed in the base member 210 as the recess portion.

The first air gaps 210-H1 are distributed in a first area AR1 of the base member 210, and the second air gaps 210-H2 are distributed in a second area AR2 of the base member 210. The first and second air gaps 210-H1 and 210-H2 are defined in the first and second areas AR1 and AR2, respectively. However, the first and second air gaps 210-H1 and 210-H2 may be distributed in the first and second areas AR1 and AR2 regardless of the first and second areas AR1 and AR2 according to embodiments.

Figure 12B:
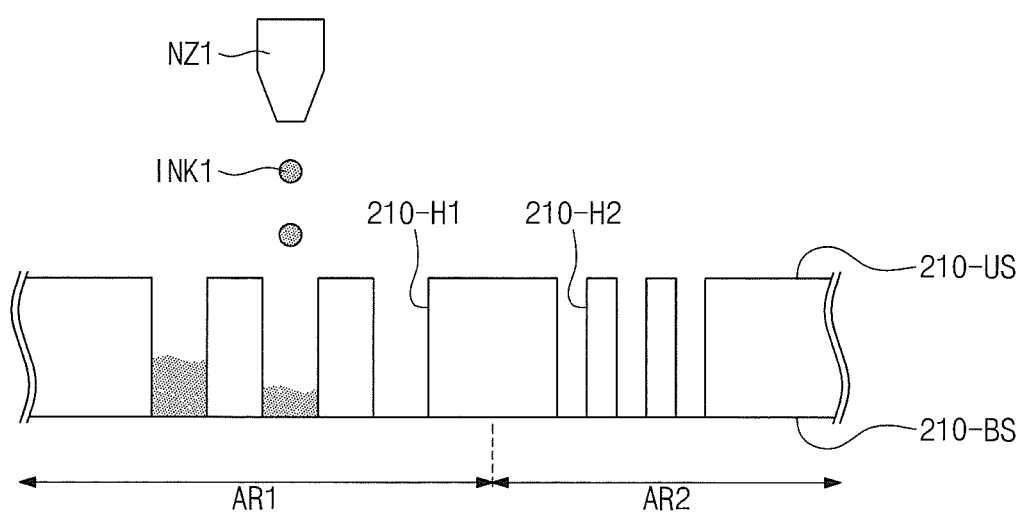
Figure 12C:
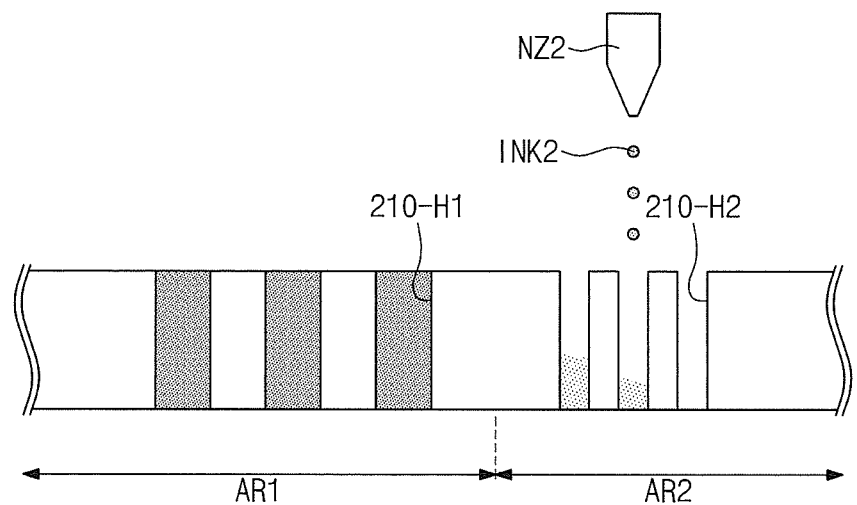

Referring to FIGS. 12B and 12C, a color source is provided to the base member 210 to represent a predetermined color. The color source includes various examples. For instance, a first color source INK1 includes pigment particles having a predetermined color, a liquid ink, or metal particles having a predetermined size. That is, the color source may be provided as a mixture of particles or in a liquid state.

In FIGS. 12B and 12C, the rear surface 210-BS of the base member 210 may be supported by a supporter (e.g., a predetermined supporter). Accordingly, one side portion of each of the first and second air gaps 210-H1 and 210-H2 is covered by the supporter, and thus the color source is stably filled in each of the first and second air gaps 210-H1 and 210-H2.

In the present exemplary embodiment, the color source includes the first color source INK1 and a second color source INK2 representing a color different from that of the first color source INK1. The first color source INK1 is provided in the first air gaps 210-H1 through a nozzle NZ1 and filled in each of the first air gaps 210-H1. In addition, the second color source INK2 is provided in the second air gaps 210-H2 through another nozzle NZ2 and filled in each of the second air gaps 210-H2.

As shown in FIGS. 12B and 12C, the first and second color sources INK1 and INK2 may be sequentially provided, respectively, through separate nozzles, but they are not limited thereto or thereby. That is, the first and second color sources INK1 and INK2 may be substantially concurrently or simultaneously provided.

Figure 12D:
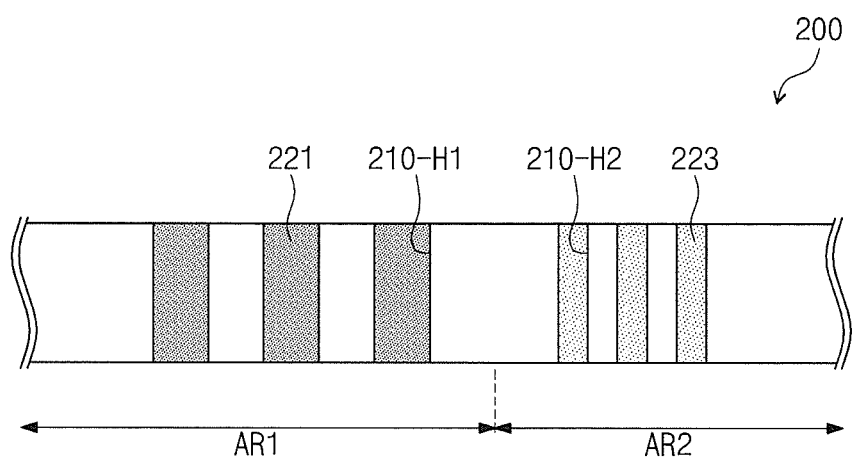

Referring to FIG. 12D, when the first and second color sources INK1 and INK2 are respectively filled in the first and second air gaps 210-H1 and 210-H2 by a predetermined amount, the window member 200 including the color member is formed through a predetermined drying or curing process.

The color member includes the first color member 221 filled in the first air gaps 210-H1 and the second color member 223 filled in the second air gaps 210-H2. Therefore, the area having the predetermined color may be easily formed in the single base member 210 and the areas having different colors may be easily formed in the sing base member 210. According to the present exemplary embodiment, the window member integrally formed with the bezel of the display device may be formed.

FIGS. 13A to 13D are cross-sectional views showing a method of manufacturing a window member according to an exemplary embodiment of the present disclosure. For the convenience of explanation, FIGS. 13A to 13D show areas corresponding to those shown in FIGS. 12A to 12D.

Figure 13A:
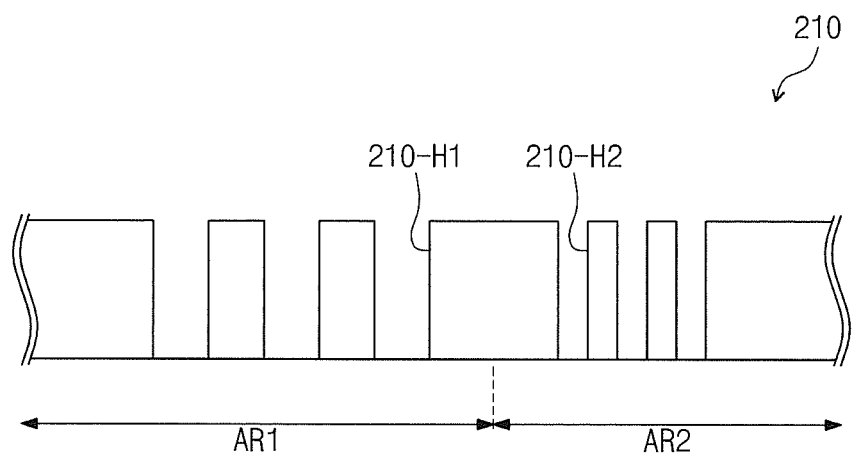
FIGS. 13A to 13D are cross-sectional views showing a method of manufacturing a window member according to an exemplary embodiment of the present disclosure.
Figure 13B:
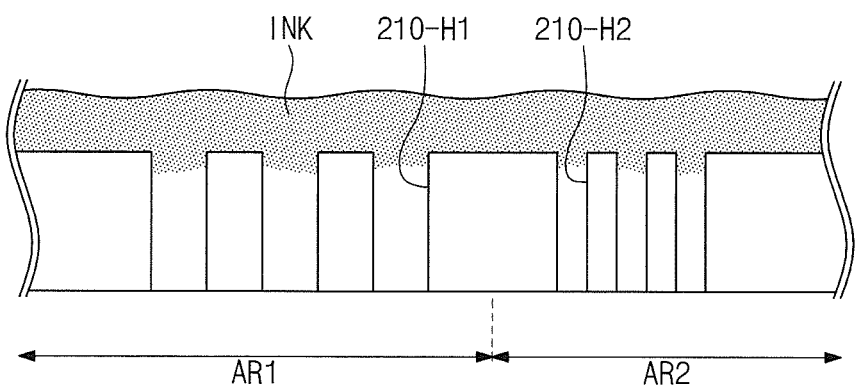

Referring to FIGS. 13A and 13B, a predetermined color ink INK is coated on a base member 210 in which first and second air gaps 210-H1 and 210-H2 are defined. A lower portion of each of the first and second air gaps 210-H1 and 210-H2 may be covered by a supporter (e.g., a predetermined supporter). The color source INK may be provided in a liquid state or includes plural particles each having a nano-size.

Figure 13C:
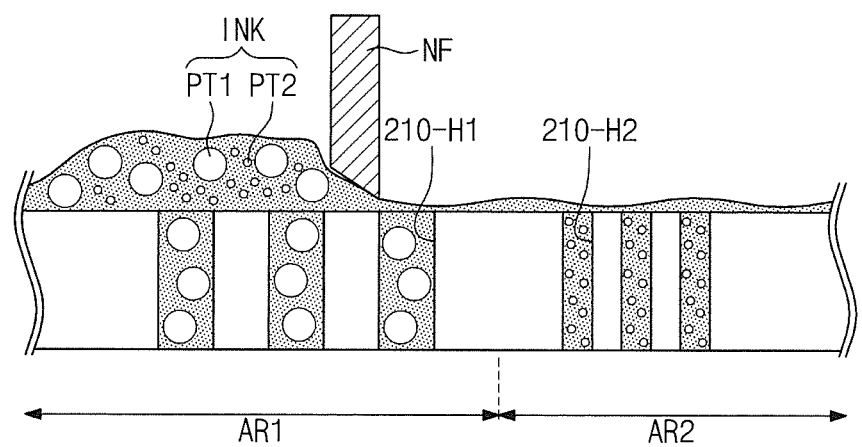
Figure 13D:
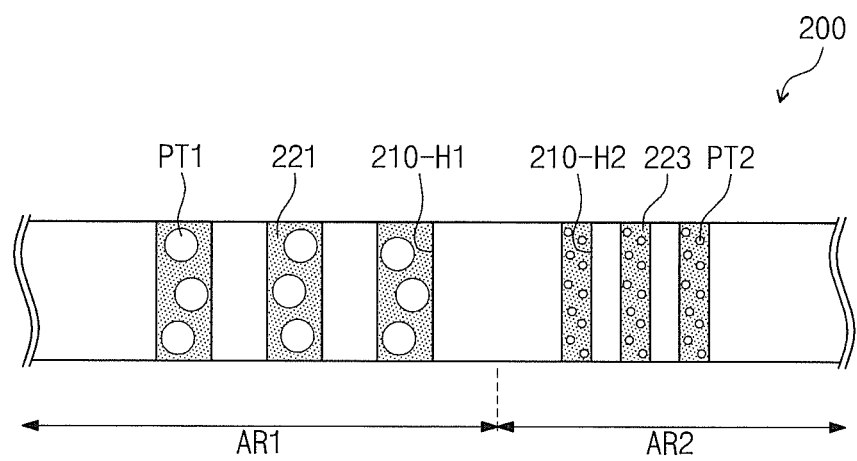

Referring to FIG. 13C, the color source INK is filled in the first and second air gaps 210-H1 and 210-H2 using a predetermined coating bar NF. The color source INK includes first particles PT1 and second particles PT2, and a portion of the first and second particles PT1 and PT2 is shown in FIG. 13C.

In an embodiment, the color source INK may further include a predetermined binder to couple the first particles PT1 and the second particles PT2. In one embodiment, the color source INK may further include a dispersing agent to allow the first particles PT1 to be evenly mixed with the second particles PT2. However, the color source INK according to one or more embodiments is not limited to the above-mentioned embodiments.

The coating bar NF is provided on the base member 210 on which the color source INK is coated. The coating bar NF applies a pressure (e.g., a predetermined pressure) on the color source INK along an upper portion of the base member 210. Thus, the color source INK is filled in the first and second air gaps 210-H1 and 210-H2.

In the case where the cross-sectional area of the second air gaps 210-H2 is smaller than the size of each of the first particles PT1, the first particles PT1 are not filled in the second air gaps 210-H2, and only the second particles PT2 are filled in the second air gap 210-H2. Accordingly, although various particles are provided after being mixed, the particles are filled in corresponding air gaps according to the cross-sectional area of the air gaps.

The method of forming the window member according to the present exemplary embodiment may realize the areas having two or more different colors through a single coating process since the cross-sectional area of the air gap is controlled. Therefore, a manufacturing cost of the window member is reduced and a manufacturing process of the window member is simplified, thereby improving a yield of the window member.

According to various embodiments, the window member may be formed by various coating processes. For instance, the window member may be formed by a slot die coating process, an air knife coating process, a spin coating process, or a spray process.

The window member according to an exemplary embodiment may define the bezel area using the coating process rather than a printing process. Since the coating process may be performed at a relatively low temperature compared with the printing process and the pressure applied to the window member in the coating process may be reduced, the window member may be prevented or substantially prevented from being damaged.

Although some exemplary embodiments of the present invention have been described, it is to be understood that the present invention is not limited to these exemplary embodiments, but, rather, various changes and modifications can be made by one of ordinary skill in the art within the spirit and scope of the present invention as hereinafter claimed.

What is claimed is:

1. A display device comprising:
a display member configured to display an image; and
a window member divided into a transmission area configured to transmit the image, and a bezel area having a color and arranged adjacent to the transmission area in a plan view, the window member comprising:
   a base member comprising a transparent material, a plurality of air gaps being defined in an area of the base member that is in the bezel area, each of the plurality of air gaps penetrating the base member or recessed from an outer surface of the base member; and
   a color member in the air gaps to define the color of the bezel area.

2. A display device comprising:
a display member configured to display an image; and
a window member divided into a transmission area configured to transmit the image, and a bezel area having a color and arranged adjacent to the transmission area in a plan view, the window member comprising:
   a base member in which a plurality of air gaps are defined in an area of the base member that is in the bezel area; and
   a color member in the air gaps to define the color of the bezel area,
   wherein each of the air gaps has an average cross-sectional size equal to or greater than about 10 nm and equal to or smaller than about 1000 nm.

3. The display device of claim 2, wherein the air gaps are randomly arranged in the base member.

4. The display device of claim 2, wherein the base member comprises a front surface facing the display member, a rear surface exposed to an outside, and a plurality of connecting surfaces connecting the front surface and the rear surface, and at least one side portion of the color member is exposed on the front surface.

5. The display device of claim 4, wherein the cross-sectional size of each of the air gaps decreases as a distance from the rear surface to a respective cross-sectional plane of each of the air gaps decreases.

6. The display device of claim 4, wherein at least one of the air gaps penetrates through the base member.

7. The display device of claim 6, wherein the window member further comprises an insulating layer on at least one of the front surface and the rear surface to cover the bezel area, and the one side portion of the cover member contacts the insulating layer.

8. The display device of claim 1, wherein the color member comprises a plurality of particles.

9. The display device of claim 8, wherein the particles comprise pigments, dyes, or mixed particles of the pigments and the dyes, each of which has the color of the bezel area.

10. The display device of claim 8, wherein the particles comprise a plurality of metal particles.

11. The display device of claim 8, wherein the color member comprises a first color member representing a first color and a second color member representing a second color different from the first color.

12. The display device of claim 11, wherein an average size of the particles included in the first color member is different from an average size of the particles included in the second color member.

13. A display device comprising:
a display member configured to display an image; and
a window member divided into a transmission area configured to transmit the image, and a bezel area having a color and arranged adjacent to the transmission area in a plan view, the window member comprising:
   a base member in which a plurality of air gaps are defined in an area of the base member that is in the bezel area; and
   a color member in the air gaps to define the color of the bezel area,
   wherein the color member comprises a plurality of particles,
   wherein the color member comprises a first color member representing a first color and a second color member representing a second color different from the first color, and
   wherein the air gaps comprise:

a plurality of first air gaps in which the first color member is arranged; and a plurality of second air gaps in which the second color member is arranged.

14. The display device of claim 13, wherein each of the first air gaps has a size different from a size of each of the second air gaps.

15. The display device of claim 13, wherein the first air gaps are distributed in an entire area of the bezel area, and the second air gaps are concentrated in a portion of the bezel area.

16. The display device of claim 1, wherein the color member is partially filled in each of the air gaps.

17. The display device of claim 16, wherein the window member further comprises a filling member having a refractive index different from a refractive index of the base member, and each of the air gaps is filled with the color member and the filling member.

18. The display device of claim 17, wherein the refractive index of the filling member is less than about 1.5.

19. The display device of claim 18, further comprising a cover member on the window member, wherein the cover member is a glass substrate or a plastic substrate.

20. The display device of claim 18, wherein the window member further comprises an intermediate member between the base member and the display member and having a color, the intermediate member is overlapped with the bezel area, and the color of the intermediate member is substantially the same as a color of the color member.

21. The display device of claim 20, wherein the color of the intermediate member is a white color.

22. The display device of claim 17, wherein the filling member has a thickness exceeding about 1 μm.

23. The display device of claim 1, wherein at least a portion of the bezel area in the window member is bent, and the color member is in a bent area of the bezel area.

24. The display device of claim 23, further comprising an adhesive member between the window member and the display member to couple the window member and the display member, wherein the display member and the adhesive member are bent to correspond to the window member.

25. A display device comprising:
a display member configured to display an image; and
a window member divided into a transmission area configured to transmit the image, and a bezel area having a color and arranged adjacent to the transmission area, the window member comprising:
a base member comprising a transparent material, a plurality of air gaps being defined in an area of the base member that is in the bezel area, each of the plurality of air gaps penetrating the base member or recessed from an outer surface of the base member; and
a plurality of particles in the air gaps to define the color of the bezel area.

26. The display device of claim 25, wherein each of the air gaps has a size equal to or greater than about 10 nm and equal to or smaller than about 1000 nm.

27. The display device of claim 26, wherein the particles comprise a plurality of pigment particles, a plurality of dye particles, or a mixture of the pigment particles and the dye particles.

28. The display device of claim 26, wherein the particles comprise a plurality of metal particles.

29. The display device of claim 28, wherein the metal particles comprise a first metal particle representing a first color and a second metal particle representing a second color, and the first metal particle has a size different from a size of the second metal particle.

* * * * *